(12) United States Patent
Choi et al.

(10) Patent No.: US 9,620,577 B2
(45) Date of Patent: Apr. 11, 2017

(54) ORGANIC LIGHT EMITTING DISPLAY DEVICE AND METHOD OF MANUFACTURING THE SAME

(71) Applicant: Samsung Display Co., LTD., Yongin, Gyeonggi-Do (KR)

(72) Inventors: Kwang-Young Choi, Incheon (KR); Sang-Ho Park, Suwon-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/942,173

(22) Filed: Nov. 16, 2015

(65) Prior Publication Data

US 2016/0254337 A1  Sep. 1, 2016

(30) Foreign Application Priority Data

Feb. 26, 2015 (KR) .......... 10-2015-0026963

(51) Int. Cl.
  *H01L 27/00* (2006.01)
  *H01L 27/32* (2006.01)
(52) U.S. Cl.
  CPC ...... *H01L 27/3272* (2013.01); *H01L 27/3265* (2013.01); *H01L 27/3262* (2013.01)

(58) Field of Classification Search
  CPC ................................. H01L 27/3272
  See application file for complete search history.

(56) References Cited

U.S. PATENT DOCUMENTS

2013/0270527 A1* 10/2013 Kwon ............... H01L 33/0041
257/40

FOREIGN PATENT DOCUMENTS

| JP | 2004347838 A | 12/2004 |
|---|---|---|
| KR | 100805270 B1 | 2/2008 |
| KR | 1020080071356 A | 8/2008 |
| KR | 1020110111104 A | 10/2011 |

* cited by examiner

*Primary Examiner* — William Harriston
(74) *Attorney, Agent, or Firm* — Cantor Colburn LLP

(57) ABSTRACT

An organic light emitting display device includes a substrate including a light-emitting region and a transparent region, a transistor disposed in the light-emitting region and including a gate electrode, a source electrode and a drain electrode overlapping the gate electrode, a capacitor disposed in the light-emitting region and disposed adjacent to the transistor and including a first capacitor electrode and a second capacitor electrode overlapping the first capacitor electrode, and a plurality of light-blocking patterns partially overlapping the gate electrode, the source electrode or the drain electrode and disposed on a different layer as a layer the gate electrode, the source electrode or the drain electrode are disposed.

18 Claims, 34 Drawing Sheets

ORGANIC LIGHT EMITTING DISPLAY DEVICE AND METHOD OF MANUFACTURING THE SAME

This application claims priority to Korean Patent Application No. 10-2015-0026963, filed on Feb. 26, 2015, and all the benefits accruing therefrom under 35 U.S.C. §119, the content of which in its entirety is herein incorporated by reference.

BACKGROUND

1. Field

Exemplary embodiments of the invention relate to an organic light emitting display ("OLED") device and a method of manufacturing the OLED device. More particularly, exemplary embodiments relate to an OLED device capable of increasing visibility and a method of manufacturing the OLED device.

2. Description of the Related Art

A flat panel display ("FPD") device is widely used as a display device of an electronic device because the flat panel display device is lightweight and thin compared to a cathode-ray tube ("CRT") display device. Typical examples of the flat panel display device are a liquid crystal display ("LCD") device and an organic light emitting diode ("OLED") display device. Compared to the LCD, the OLED has many advantages such as a higher luminance and a wider viewing angle. In addition, the OLED display device can be made thinner because the OLED display device does not require a backlight. In the OLED display device, electrons and holes are injected into an organic thin layer through a cathode and an anode, and then recombined in the organic thin layer to generate excitons, thereby a light of a certain wavelength can be emitted.

Recently, a transparent OLED device has been rapidly developed. The transparent OLED device may include a transparent region and an opaque region. In the transparent OLED device, an image of an object before or after a transparent region of the OLED device may be recognized when the OLED device is in an ON state. In an OFF state of the OLED device, an image may be displayed in a pixel region of the OLED device.

SUMMARY

In a conventional transparent organic light emitting display ("OLED") device, since transistors and capacitors are positioned in an opaque region, light due to reflection by metal wirings may be incident to an opaque region. Therefore, blurring of images may be occurred.

Exemplary embodiments of the invention provide an OLED device capable of increasing visibility.

Exemplary embodiments of the invention further provide a method of manufacturing the OLED device.

In an exemplary embodiment of an OLED device according to the invention, the OLED device includes a substrate comprising a light-emitting region and a transparent region, a transistor disposed in the light-emitting region and including a gate electrode, a source electrode and a drain electrode overlapping the gate electrode, a capacitor disposed in the light-emitting region and disposed adjacent to the transistor and including a first capacitor electrode and a second capacitor electrode overlapping the first capacitor electrode, and a plurality of light-blocking patterns partially overlapping the gate electrode, the source electrode or the drain electrode and disposed on a different layer as a layer the gate electrode, the source electrode or the drain electrode are disposed.

In an exemplary embodiment, the light-blocking patterns may be disposed on the same layer as the second capacitor electrode.

In an exemplary embodiment, the light-blocking patterns may be insulated from the second capacitor electrode.

In an exemplary embodiment, the light-blocking patterns may include the same material as the second capacitor electrode.

In an exemplary embodiment, the light-blocking patterns may be disposed in a region on which the gate electrode, the source electrode and the drain electrode are not disposed in a plan view.

In an exemplary embodiment, the light-blocking patterns may include opaque material.

In an exemplary embodiment, the light-blocking patterns my include a first light-blocking pattern disposed in the light-emitting region and a second light-blocking pattern extending in a first direction to be disposed in the light-emitting region and the transparent region, and overlapping a data line electrically connected with the source electrode.

In an exemplary embodiment, the OLED device may further include a first electrode disposed in the light-emitting region and electrically connected with the drain electrode, an emission layer disposed on the first electrode and a second electrode disposed on the emission layer, and disposed in the light-emitting region and the transparent region.

In an exemplary embodiment, the first electrode may include opaque material.

In an exemplary embodiment, a width of a first direction of the first electrode may be wider than a width of a first direction of the emission layer by more than about 5 micrometers ($\mu$).

In an exemplary embodiment of a method of manufacturing an OLED device according to the invention, the method includes forming a gate electrode and a first capacitor electrode on a substrate comprising a light-emitting region and a transparent region and forming a source electrode, a drain electrode, a second capacitor electrode and a plurality of light-blocking patterns on the substrate on which the gate electrode and a first capacitor electrode are provided. The light-blocking patterns partially overlap the gate electrode, the source electrode or the drain electrode, and are disposed on a different layer as a layer the gate electrode, the source electrode or the drain electrode are disposed.

In an exemplary embodiment, the light-blocking patterns may be disposed on the same layer as the second capacitor electrode.

In an exemplary embodiment, the light-blocking patterns may be insulated from the second capacitor electrode.

In an exemplary embodiment, the light-blocking patterns may include the same material as the second capacitor electrode.

In an exemplary embodiment, the light-blocking patterns may be disposed in a region on which the gate electrode, the source electrode and the drain electrode are not disposed in a plan view.

In an exemplary embodiment, the light-blocking patterns may include opaque material.

In an exemplary embodiment, the light-blocking patterns may include a first light-blocking pattern disposed in the light-emitting region and a second light-blocking pattern extending in a first direction to be disposed in the light-emitting region and the transparent region, and overlapping a data line electrically connected with the source electrode.

In an exemplary embodiment, the method may further include forming a first electrode electrically connected with the drain electrode in the light-emitting region, forming an emission layer on the first electrode and forming second electrode disposed on the emission layer.

In an exemplary embodiment, the first electrode may include opaque material.

In an exemplary embodiment, a width of a first direction of the first electrode may be wider than a width of a first direction of the emission layer by more than about 5μ.

According to the exemplary embodiment, the OLED device light-blocking patterns disposed on the tiny openings. Thus, light transmitted via the tiny openings may be blocked. Accordingly, visibility of a display device may be improved.

In addition, the first electrode includes opaque material, and thus the first electrode may block light not blocked by the light-blocking patterns. Accordingly, the first electrode additionally blocks light of the light-emitting region II, and thus visibility of a display device may be improved.

BRIEF DESCRIPTION OF THE DRAWINGS

The above and other features and advantages of the invention will become more apparent by describing in detailed exemplary embodiments thereof with reference to the accompanying drawings, in which.

DETAILED DESCRIPTION

Figure 1:
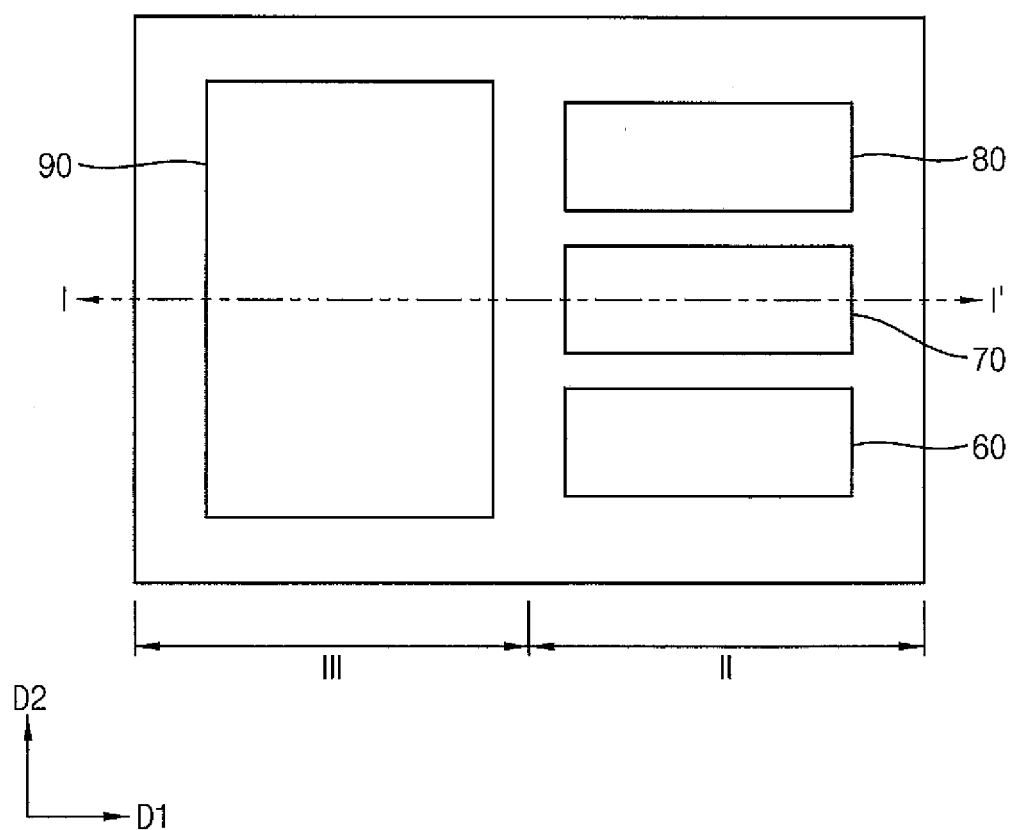
FIG. 1 is a plan view illustrating an exemplary embodiment of an organic light emitting display ("OLED") device according to the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, the invention will be explained in detail with reference to the accompanying drawings.

Figure 2:
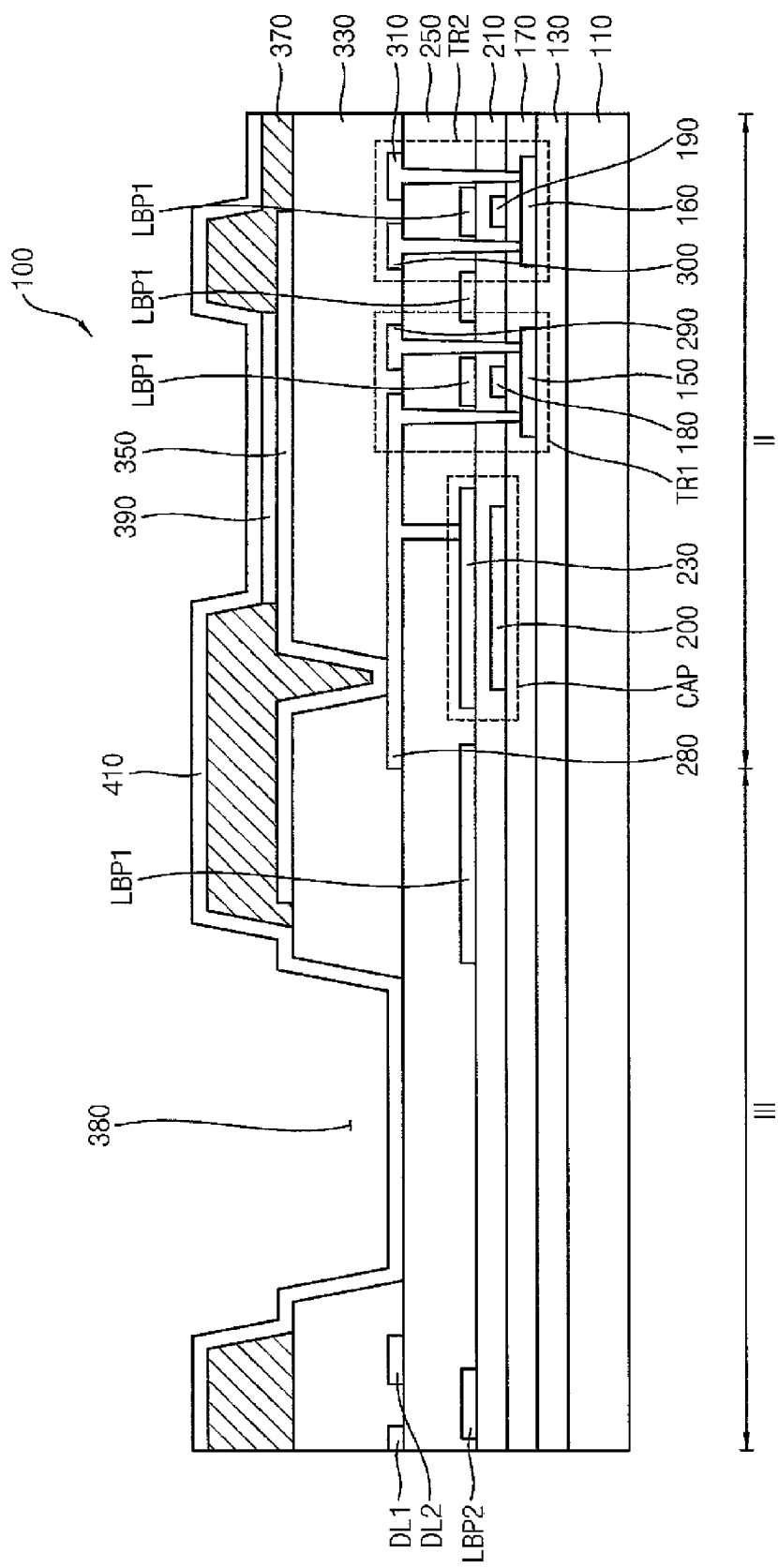
FIG. 2 is a cross-sectional view taken along line I-I' of FIG. 1.
Figure 3:
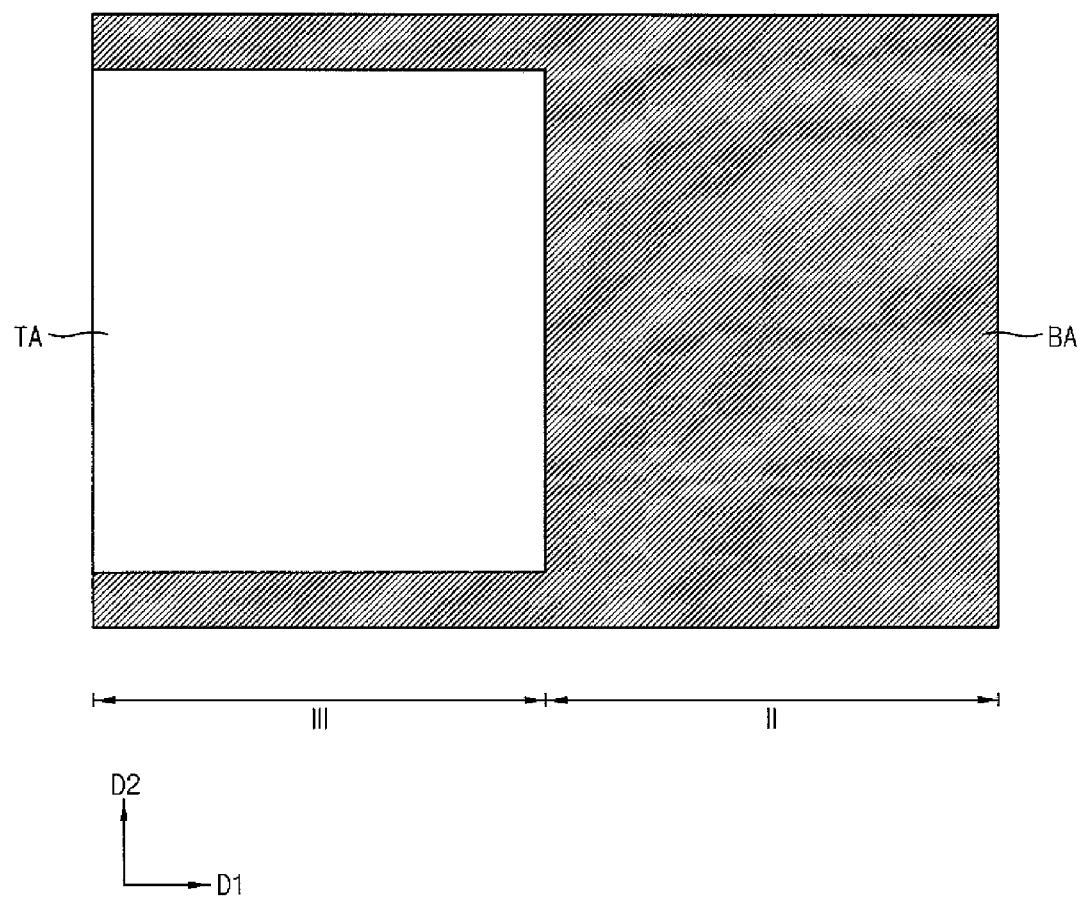
FIG. 3 is a plan view illustrating an exemplary embodiment of light transmission of an OLED device according to the invention.

FIG. 1 is a plan view illustrating an organic light emitting display ("OLED") device according to an exemplary embodiment of the invention. FIG. 2 is a cross-sectional view taken along line I-I' of FIG. 1. FIG. 3 is a plan view illustrating light transmission of an OLED device according to an exemplary embodiment of the invention.

Referring to FIGS. 1 and 2, an OLED device according to an exemplary embodiment of the invention may include a light-emitting region II and a transparent region III. Pixels 60, 70, and 80 may be positioned in the light-emitting region II, and a transparent window 90 may be positioned in the transparent region III. In an exemplary embodiment, the pixel 60 may be a pixel emitting a red color, the pixel 70 may be a pixel emitting a green color, and the pixel 80 may be a pixel emitting a blue color, for example. The transparent window 90 may transmit an external light. Here, wires or lines (e.g., data lines, scan lines, power supply electrodes, etc.) and insulating layers (e.g., a pixel defining layer, via layer, etc.) may be disposed in an area (e.g., a dead space) surrounding the pixels 60, 70, and 80 and the transparent window 90.

The OLED device 100 may include a substrate 110, a driving transistor TR1, a switching transistor TR2, a storage capacitor CAP, a power supply electrode 280, a buffer layer 130, an insulating interlayer 170, a gate insulating layer 210, a first insulating layer 250, a second insulating layer 330, a first electrode 350, a pixel defining layer 370, a transparent window 380, an emission layer 390, a second electrode 410, etc. In exemplary embodiments, the OLED device 100 may include a light-emitting region II and a transparent region III. The driving transistor TR1, the switching transistor TR2, the storage capacitor CAP, the power supply electrode 280, the second insulating layer 330, the first electrode 350, the emission layer 390 may be positioned in the light-emitting region II. In an exemplary embodiment, the transparent window 380 may be positioned in the transparent region III. In an exemplary embodiment, an image may be displayed in the light-emitting region II, and objects or images located opposite to the OLED device 100 may be transmitted in the transparent region III, for example.

In an exemplary embodiment, the substrate 110 may include a transparent inorganic material or flexible plastic, for example. In an exemplary embodiment, the substrate 110 may include a glass substrate, a quartz substrate, etc., for example. In an alternative exemplary embodiment, the substrate 110 may include a flexible transparent resin substrate, for example. In an exemplary embodiment, the flexible transparent resin substrate for the substrate 110 may include a polyimide substrate, for example. In an exemplary embodiment, the polyimide substrate may include a first polyimide layer, a barrier film layer, a second polyimide layer, etc., for example.

In exemplary embodiments, the substrate 110 may have a structure in which the first polyimide layer, the barrier film layer and the second polyimide layer are stacked on a glass substrate, for example. In an exemplary embodiment, after an insulation layer is provided on the second polyimide layer, upper structures including a light emitting structure (e.g., the driving transistor TR1, the switching transistor TR2, the storage capacitor CAP, the power supply electrode 280, the first electrode 350, the emission layer 390, the second electrode 410, etc.) may be disposed on the insulation layer. After the upper structures are disposed on the insulation layer, the glass substrate may be removed. It may be difficult that the upper structures are directly disposed on the polyimide substrate because the polyimide substrate is thin and flexible. Accordingly, the upper structures are disposed on a rigid glass substrate, and then the polyimide substrate may be used as the substrate 110 after a removal of the glass substrate. As the OLED device 100 may include the light-emitting region II and the transparent region III, the substrate 110 may also include the light-emitting region II and the transparent region III.

The buffer layer 130 may be disposed on the substrate 110. As illustrated in FIG. 2, the buffer layer 130 may extend from the light-emitting region II into the transparent region III. In an exemplary embodiment, the buffer layer 130 may prevent the diffusion (e.g., an out gassing) of metal atoms and/or impurities from the substrate 110. In an exemplary embodiment, the buffer layer 130 may control a rate of a heat transfer in a crystallization process for forming a first active pattern 150 and a second active pattern 160, thereby obtaining substantially uniform the first and the second active patterns 150 and 160.

Furthermore, the buffer layer 130 may improve a surface flatness of the substrate 110 when a surface of the substrate 110 is relatively irregular. In an exemplary embodiment, the buffer layer 130 may include silicon nitride, silicon oxide, etc., for example. In exemplary embodiments, only one buffer layer or no buffer layer may be provided on the substrate 110 in accordance with the type of the substrate 110. When the buffer layer 130 includes the silicon oxide, an external light penetrated to the transparent region III of the OLED device 100 may transmit the buffer layer 130.

In exemplary embodiments, according to a type of the substrate 110, at least two buffer layers may be provided on the substrate 110, or the buffer layer may not be disposed.

The driving transistor TR1 may be disposed on the buffer layer 130. In exemplary embodiments, the driving transistor TR1 may include a first active pattern 150, the insulating interlayer 170, a first gate electrode 180, the gate insulating layer 210, the first insulating layer 250, a first source electrode, a first drain electrode 290, etc. Here, the first source electrode may be connected to the power supply electrode 280, and a high power supply voltage may be applied to the first source electrode. In an exemplary embodiment, the OLED device 100 may include the power supply electrode 280 (e.g., a high power supply electrode) and a low power supply electrode (not shown). The high power supply voltage may be provided to the power supply electrode 280, and the low power supply voltage may be provided to the low power supply electrode.

The switching transistor TR2 may be disposed on the buffer layer 130. In exemplary embodiments, the switching transistor TR2 may include a second active pattern 160, the insulating interlayer 170, a second gate electrode 190, the gate insulating layer 210, the first insulating layer 250, a second source electrode 300, a second drain electrode 310, etc.

The storage capacitor CAP may be disposed on the insulating interlayer 170. In exemplary embodiments, the storage capacitor CAP may include a first capacitor electrode 200, the gate insulating layer 210, a second capacitor electrode 230, etc. Here, the second capacitor electrode 230 may be connected to the power supply electrode 280, and the high power supply voltage may be applied to the second capacitor electrode 230.

In exemplary embodiments, the driving transistor TR1 and the switching transistor TR2 may be positioned in the light-emitting region II. In the driving transistor TR1 and the switching transistor TR2, the first and second active patterns 150 and 160 may be disposed spacing apart from each other by a predetermined distance in the light-emitting region II on the buffer layer 130. In an exemplary embodiment, each of the first and second active patterns 150 and 160 may be a semiconductor device which may include an active layer including oxide semiconductor, inorganic semiconductor (e.g., amorphous silicon, polysilicon, etc.), organic semiconductor, etc., for example. The insulating interlayer 170 may be disposed on the buffer layer 130. The insulating interlayer 170 may cover the first and second active patterns 150 and 160, and may extend into the transparent region III. In an exemplary embodiment, the insulating interlayer 170 may include a silicon compound, a metal oxide, etc., for example. In exemplary embodiments, the insulating interlayer 170 may include a silicon oxide. In an exemplary embodiment, the insulating interlayer 170 may include a material substantially the same as that of the buffer layer 130. In this case, as the insulating interlayer 170 and the buffer layer 130 may be provided as the same material in the transparent region III, the insulating interlayer 170 and the buffer layer 130 may have the same refractive index. Thus, a light transmittivity may be improved in the transparent region III.

The first gate electrode 180 may be disposed on the insulating interlayer 170 under which the first active pattern 150 is positioned. The second gate electrode 190 may be disposed on the insulating interlayer 170 under which the second active pattern 160 is positioned. In an exemplary embodiment, each of the first gate electrode 180 and the second gate electrode 190 may include metal, alloy, metal nitride, conductive metal oxide, a transparent conductive material, etc., for example.

The first capacitor electrode 200 may be disposed on the insulating interlayer 170. The first capacitor electrode 200 may be spaced apart from the first gate electrode 180 by predetermined distances. In an exemplary embodiment, the first capacitor electrode 200, the first gate electrode 180, and the second gate electrode 190 may include substantially the same material. In another exemplary embodiment, each of the first capacitor electrode 200, the first gate electrode 180, and the second gate electrode 190 may include different materials.

The gate insulating layer 210 may be disposed on the insulating interlayer 170, the first capacitor electrode 200, the first gate electrode 180, and the second gate electrode 190. The gate insulating layer 210 may cover the first capacitor electrode 200, the first gate electrode 180, and the second gate electrode 190, and may extend into the transparent region III. In an exemplary embodiment, the gate insulating layer 210 may include a silicon compound, a metal oxide, etc., for example. In exemplary embodiments, the gate insulating layer 210 may include a silicon oxide, for example. In an exemplary embodiment, the gate insulating layer 210 may include a material substantially the same as that of the buffer layer 130 and the insulating interlayer 170.

In this case, as the gate insulating layer 210, the insulating interlayer 170 and the buffer layer 130 may be provided as the same material in the transparent region III, the gate insulating layer 210, the insulating interlayer 170 and the buffer layer 130 may have the same refractive index. Thus, a light transmittivity may be improved in the transparent region III.

The second capacitor electrode 230 may be disposed on the gate insulating layer 210 under which the first capacitor electrode 200 is positioned. In an exemplary embodiment, the second capacitor electrode 230 may include a material substantially the same that of the first gate electrode 180, the second gate electrode 190, and the first capacitor electrode 200. In another exemplary embodiment, each of the second capacitor electrode 230, the first gate electrode 180, the second gate electrode 190, and the first capacitor electrode 200 may include different materials.

A light-blocking pattern may be disposed on the gate insulating layer 210. The light-blocking pattern may include a first light-blocking pattern LBP1 and a second light-blocking pattern LBP2. The light-blocking pattern may be disposed on the same layer as the second capacitor electrode 230. The light-blocking pattern is insulated from the second capacitor electrode 230. The light-blocking pattern may include the same material as the second capacitor electrode 230.

The first light-blocking pattern LBP1 is disposed in the light-emitting region II. The second light-blocking pattern LBP2 extends in a first direction D1. The second light-blocking pattern LBP2 is disposed in the light-emitting region II and the transparent region III. The second light-blocking pattern LBP2 overlaps data lines DL1 and DL2 electrically connected with a source electrode.

The light-blocking pattern partially overlaps the first gate electrode 180, the second gate electrode 190, the first source electrode, the second source electrode 300, the first drain electrode 290 and the second drain electrode 310. The light-blocking pattern may be disposed in a region on which the first gate electrode 180, the second gate electrode 190, the first source electrode, the second source electrode 300, the first drain electrode 290 and the second drain electrode 310 are not disposed in a plan view. That is, the light-blocking pattern is disposed in a region on which a gate metal pattern including a gate electrode and a data metal pattern including a source electrode, a drain electrode and a data line are not disposed in a plan view.

Referring to FIGS. 2 and 3, state of light transmission of an OLED device according to an exemplary embodiment of the invention is illustrated.

The first light-blocking pattern LBP1 is disposed in the light-emitting region II. The second light-blocking pattern LBP2 is disposed in the light-emitting region II and the transparent region III. Thus, the light-blocking patterns may form a light-blocking region BA in the light-emitting region II and a portion of the transparent region III. A region on which the light-blocking patterns are not disposed may be defined as a light-transmission region TA.

The gate metal pattern and the data metal pattern are not overlapped each other completely. Thus, tiny openings may be defined in a plan view. Accordingly, visibility of a display device may be decreased due to diffraction of light via the tiny openings.

However, an OLED device according to the invention includes light-blocking patterns disposed on the tiny openings. Thus, light transmitted via the tiny openings may be blocked. Accordingly, visibility of a display device may be improved.

The first insulating layer 250 may be disposed on the gate insulating layer 210 and the second capacitor electrode 230. The first insulating layer 250 may cover the second capacitor electrode 230, and may extend into the transparent region III. In an exemplary embodiment, the first insulating layer 250 may include a silicon compound, a metal oxide, etc., for example. In exemplary embodiments, the first insulating layer 250 may include a silicon oxide. In an exemplary embodiment, the first insulating layer 250 may include materials substantially the same as that of the gate insulating layer 210, the buffer layer 130 and the insulating interlayer 170. In this case, as the first insulating layer 250, the gate insulating layer 210, the insulating interlayer 170 and the buffer layer 130 may be provided as the same material in the transparent region III, the first insulating layer 250, the gate insulating layer 210, the insulating interlayer 170 and the buffer layer 130 may have the same refractive index. Thus, a light transmittivity may be improved in the transparent region III. Accordingly, a definition of objects or images located opposite to the OLED device 100 may be increased. In addition, a thickness of the first insulating layer 250 taken along a direction perpendicular to a direction along which the substrate 110 extends in a cross section may be substantially greater than that of the gate insulating layer 210. In exemplary embodiments, as a thickness of the first insulating layer 250 is relatively increased, a coupling phenomenon that is generated between the power supply electrode 280 and the second capacitor electrode 230 may be reduced.

The power supply electrode 280, the first source electrode of the driving transistor TR1, the first drain electrode 290 of the driving transistor TR1, the second source electrode 300 of the switching transistor TR2, the second drain electrode 310 of the switching transistor TR2, a portion of the second insulating layer 330, and a portion of the first electrode 350 may be disposed in the light-emitting region II of the first insulating layer 250. A portion of the pixel defining layer 370 and a portion of the second electrode 410 may be disposed on the transparent region III of the first insulating layer 250.

The first source electrode and the first drain electrode 290 may be contacted to the first active pattern 150 by removing portions of the first insulating layer 250, the gate insulating layer 210, and the insulating interlayer 170. In an exemplary embodiment, each of the first source electrode and the first drain electrode 290 may include metal, alloy, metal nitride, conductive metal oxide, a transparent conductive material, etc., for example. These may be used alone or in a combination thereof.

The second source electrode 300 and the second drain electrode 310 may be contacted to the second active pattern 160 by removing portions of the first insulating layer 250, the gate insulating layer 210, and the insulating interlayer 170. Each of the second source electrode 300 and the second drain electrode 310 may include materials substantially the same as that of the first source electrode and the first drain electrode 290.

The power supply electrode 280 may be electrically contacted to the second capacitor electrode 230 by removing a portion of the first insulating layer 250, and may be electrically contacted to the first active pattern 150 by removing a portion of the first insulating layer 250, the gate insulating layer 210, and the insulating interlayer 170. The high power supply voltage applied to the power supply electrode 280 may be provide to the second capacitor electrode 230 and the first active pattern 150. In an exemplary embodiment, the power supply electrode 280 may include materials substantially the same as that of the first drain electrode 290, the second source electrode 300, and the second drain electrode 310.

The second insulating layer 330 may cover the first source electrode, the first drain electrode 290, the second source electrode 300, and the second drain electrode 310. The second insulating layer 330 may be disposed such that the second insulating layer 330 overlaps a portion of the power supply electrode 280. That is, at least a portion of the power supply electrode 280 may be exposed by the second insulating layer 330 disposed thereon. The second insulating layer 330 may include an inorganic material. In an exemplary embodiment, the second insulating layer 330 may include a silicon compound such as silicon oxide (SiOx), silicon nitride (SiNx), silicon oxynitride (SiOxNy), silicon oxycarbide (SiOxCy), silicon carbonitride (SiCxNy), etc. These may be used alone or in a combination thereof. In exemplary embodiments, the second insulating layer 330 may include an organic material. In an exemplary embodiment, the second insulating layer 330 may include polyimide-based resin, photoresist, acrylic-based resin, polyamide-based resin, siloxane-based resin, etc., for example. These may be used alone or in a combination thereof.

The first electrode 350 may be disposed on a portion of the power supply electrode 280 and a portion of the second insulating layer 330 in the light-emitting region II. In exemplary embodiments, the first electrode 350 may be disposed as a substantially uniform thickness along upper surfaces of the power supply electrode 280 and the second insulating layer 330.

In an exemplary embodiment, the first electrode 350 may include metal, alloy, metal nitride, conductive metal oxide, a transparent conductive material, etc., for example. In an exemplary embodiment, the first electrode 350 may include aluminum (Al), aluminum alloy, aluminum nitride (AlNx), silver (Ag), silver alloy, tungsten (W), tungsten nitride (WNx), copper (Cu), copper alloy, nickel (Ni), chrome (Cr), chrome nitride (CrNx), molybdenum (Mo), molybdenum alloy, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), indium tin oxide ("ITO"), stannum oxide (SnOx), indium oxide (InOx), gallium oxide (GaOx), indium zinc oxide ("IZO"), etc., for example. These may be used alone or in a combination thereof.

In the exemplary embodiment, the first electrode 350 may include opaque material. A width of the first electrode 350 along a first direction D1 is wider than a width of the emission layer 390 along the first direction D1 by more than about 5µ, for example. The first electrode 350 may block light not blocked by the light-blocking patterns. The first electrode 350 may additionally block light of the light-emitting region II, and thus visibility of a display device may be improved.

The pixel defining layer 370 may be disposed on the first electrode 350 and a portion of the second insulating layer 330. A first opening and a second opening may be defined in the pixel defining layer 370. In the light-emitting region II, the first opening of the pixel defining layer 370 may be positioned on a portion of the first electrode 350 disposed on the second insulating layer 330. The emission layer 390 may be disposed in the first opening. In addition, the second opening of the pixel defining layer 370 may be positioned in the transparent region III. The second opening may be defined as the transparent window 380. The pixel defining layer 370 may include organic materials or inorganic materials. These may be used alone or in a combination thereof.

In an exemplary embodiment, the pixel defining layer 370 may include materials substantially the same as that of the second insulating layer 330.

The emission layer 390 may be disposed on the first electrode 350 which is exposed via the first opening of the pixel defining layer 370. The emission layer 390 may be provided using light emitting materials capable of generating different colors of light (e.g., a red color of light, a blue color of light, and a green color of light). In an exemplary embodiment, the emission layer 390 may generally generate a white color of light by stacking a plurality of light emitting materials capable of generating different colors of light such as a red color of light, a green color of light, a blue color of light, etc.

The second electrode 410 may be disposed on the pixel defining layer 370, the emission layer 390, the first insulating layer 250 and the second insulating layer 330. In an exemplary embodiment, the second electrode 410 may be disposed as a substantially uniform thickness along upper surfaces of the pixel defining layer 370, the emission layer 390, the first insulating layer 250 and the second insulating layer 330. The second electrode 410 may be contacted to a portion of the second insulating layer 330 via the second opening of the pixel defining layer 370, and may extend into the transparent region III. That is, the second electrode 410 may extend into the second opening. In exemplary embodiments, the second electrode 410 may include a transparent conductive material. In an exemplary embodiment, the second electrode 410 may include ITO, SnOx, InOx, GaOx, IZO, etc., for example. Thus, the second electrode 410 positioned in the transparent region III may not substantially reduce a transmittivity of the transparent region III. In an exemplary embodiment, the second electrode 410 may include materials substantially the same as that of the first electrode 350.

FIGS. 4 to 12 are cross-sectional views illustrating a method of manufacturing the OLED device of FIG. 2.

Figure 4:
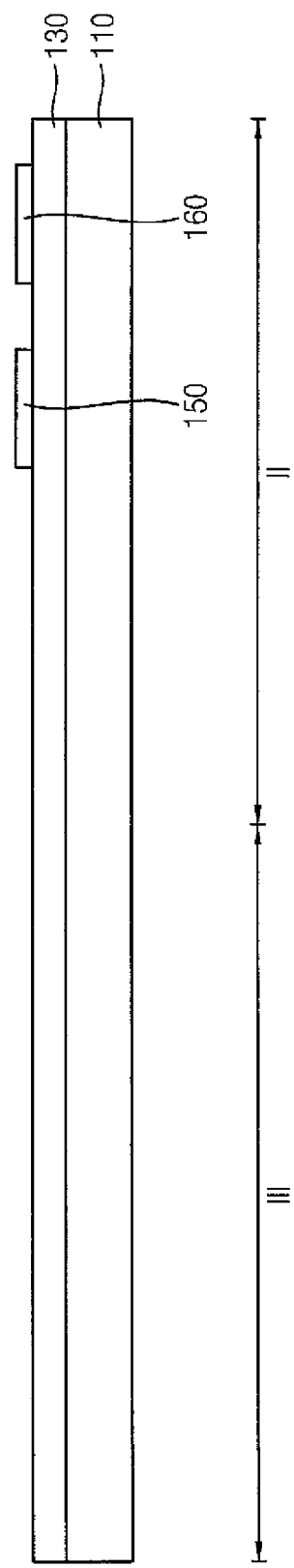
FIGS. 4 to 12 are cross-sectional views illustrating a method of manufacturing the OLED device of FIG. 2.

Referring to FIG. 4, a buffer layer 130 is disposed on a substrate 110. Thereafter, a first active pattern 150 and a second active pattern 160 are disposed on the buffer layer 130.

The buffer layer 130 may extend from the light-emitting region II into the transparent region III. The buffer layer 130 may prevent the diffusion (e.g., an out gassing) of metal atoms and/or impurities from the substrate 110. Additionally, the buffer layer 130 may control a rate of a heat transfer in a crystallization process for forming a first active pattern 150 and a second active pattern 160, thereby obtaining substantially uniform the first and the second active patterns 150 and 160.

Furthermore, the buffer layer 130 may improve a surface flatness of the substrate 110 when a surface of the substrate 110 is relatively irregular. In an exemplary embodiment, the buffer layer 130 may include silicon nitride, silicon oxide, etc., for example. When the buffer layer 130 includes the silicon oxide, an external light penetrated to the transparent region III of the OLED device 100 may transmit the buffer layer 130.

In exemplary embodiments, according to a type of the substrate 110, at least two buffer layers may be provided on the substrate 110, or the buffer layer may not be disposed.

The first and the second active patterns 150 and 160 may be positioned on the buffer layer 130 on the light-emitting region II. The second active pattern 160 may be spaced apart from the first active pattern 150 along the first direction.

Each of the first and the second active patterns 150 and 160 may include a material including silicon or oxide semiconductor.

Figure 5:
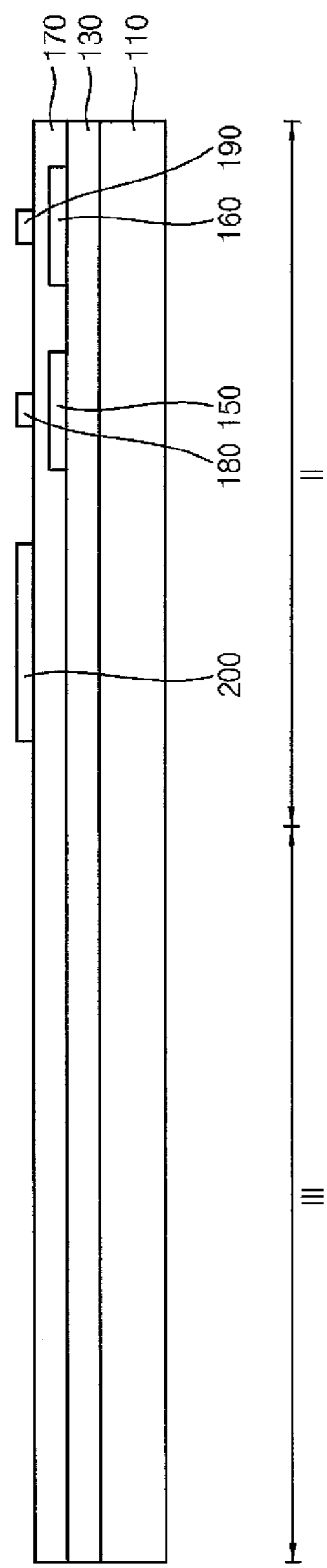

Referring to FIG. 5, a insulating interlayer 170 is disposed on the substrate 110 on which the buffer layer 130 is disposed. Thereafter, a first gate electrode 180, a second gate electrode 190 and a first capacitor electrode 200 are disposed on the insulating interlayer 170.

The insulating interlayer 170 may be disposed on the buffer layer 130. The insulating interlayer 170 may cover the first and second active patterns 150 and 160, and may extend into the transparent region III. In an exemplary embodiment, the insulating interlayer 170 may include a silicon compound, a metal oxide, etc., for example. In exemplary embodiments, the insulating interlayer 170 may include a silicon oxide. In an exemplary embodiment, the insulating interlayer 170 may include a material substantially the same as that of the buffer layer 130. In this case, as the insulating interlayer 170 and the buffer layer 130 may be provided as the same material in the transparent region III, the insulating interlayer 170 and the buffer layer 130 may have the same refractive index. Thus, a light transmittivity may be improved in the transparent region III.

The first gate electrode 180 may be disposed on the insulating interlayer 170 under which the first active pattern 150 is positioned. The second gate electrode 190 may be disposed on the insulating interlayer 170 under which the second active pattern 160 is positioned. Each of the first gate electrode 180 and the second gate electrode 190 may include metal, alloy, metal nitride, conductive metal oxide, a transparent conductive material, etc., for example.

The first capacitor electrode 200 may be disposed on the insulating interlayer 170. The first capacitor electrode 200 may be spaced apart from the first gate electrode 180 by predetermined distances. The first capacitor electrode 200, the first gate electrode 180, and the second gate electrode 190 may include substantially the same material. In an exemplary embodiment, each of the first capacitor electrode 200, the first gate electrode 180, and the second gate electrode 190 may include different materials.

Figure 6:
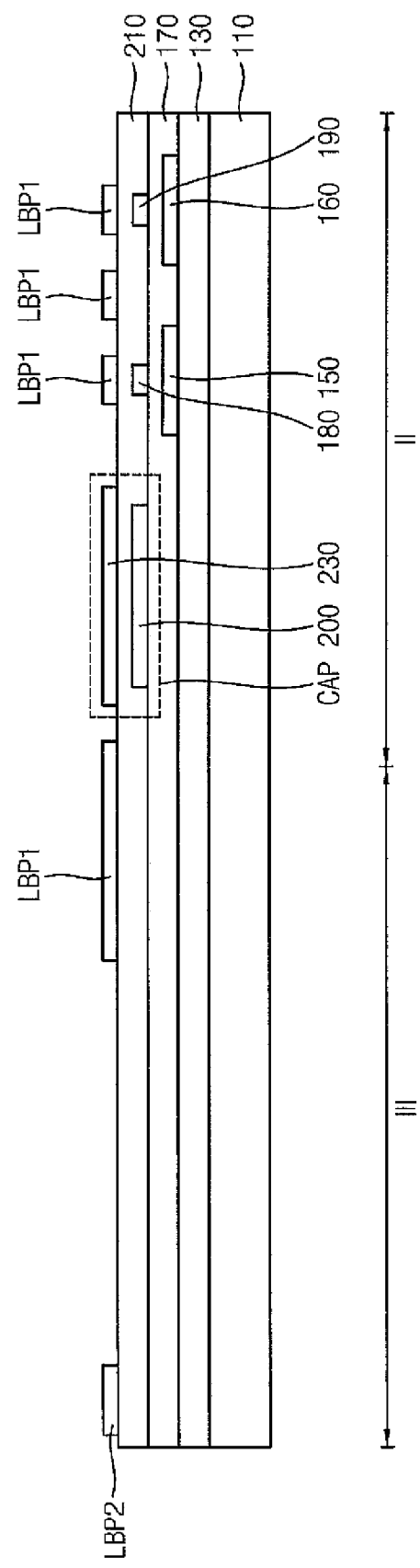

Referring to FIG. 6, a gate insulating layer 210 is disposed on the substrate 110 on which the first gate electrode 180, the second gate electrode 190 and the first capacitor electrode 200 are disposed. Thereafter, a second capacitor electrode 230 and a light-blocking pattern are disposed on the gate insulating layer 210. The light-blocking pattern may include a first light-blocking pattern LBP1 and a second light-blocking pattern LBP2.

The gate insulating layer 210 may be disposed on the insulating interlayer 170, the first capacitor electrode 200, the first gate electrode 180, and the second gate electrode 190. The gate insulating layer 210 may cover the first capacitor electrode 200, the first gate electrode 180, and the second gate electrode 190, and may extend into the transparent region III. In an exemplary embodiment, the gate insulating layer 210 may include a silicon compound, a metal oxide, etc., for example. In exemplary embodiments, the gate insulating layer 210 may include a silicon oxide. In an exemplary embodiment, the gate insulating layer 210 may include a material substantially the same as that of the buffer layer 130 and the insulating interlayer 170. In this case, as the gate insulating layer 210, the insulating interlayer 170 and the buffer layer 130 may be provided as the same material in the transparent region III, the gate insulating layer 210, the insulating interlayer 170 and the buffer layer 130 may have the same refractive index. Thus, a light transmittivity may be improved in the transparent region III.

The second capacitor electrode 230 may be disposed on the gate insulating layer 210 under which the first capacitor electrode 200 is positioned. The second capacitor electrode 230 may include a material substantially the same that of the first gate electrode 180, the second gate electrode 190, and the first capacitor electrode 200. In an exemplary embodiment, each of the second capacitor electrode 230, the first gate electrode 180, the second gate electrode 190, and the first capacitor electrode 200 may include different materials.

The light-blocking pattern may be disposed on the same layer as the second capacitor electrode 230. The light-blocking pattern is insulated from the second capacitor electrode 230. The light-blocking pattern may include the same material as the second capacitor electrode 230.

The first light-blocking pattern LBP1 is disposed in the light-emitting region II. The second light-blocking pattern LBP2 extends in a first direction D1. The second light-blocking pattern LBP2 is disposed in the light-emitting region II and the transparent region III. The second light-blocking pattern LBP2 overlaps data lines DL1 and DL2 electrically connected with a source electrode.

The light-blocking pattern partially overlaps the first gate electrode 180, the second gate electrode 190, the first source electrode, the second source electrode 300, the first drain electrode 290 and the second drain electrode 310. The light-blocking pattern may be disposed in a region on which the first gate electrode 180, the second gate electrode 190, the first source electrode, the second source electrode 300, the first drain electrode 290 and the second drain electrode 310 are not disposed in a plan view. That is, the light-blocking pattern is disposed in a region on which a gate metal pattern including a gate electrode and a data metal pattern including a source electrode, a drain electrode and a data line are not disposed in a plan view.

Figure 7:
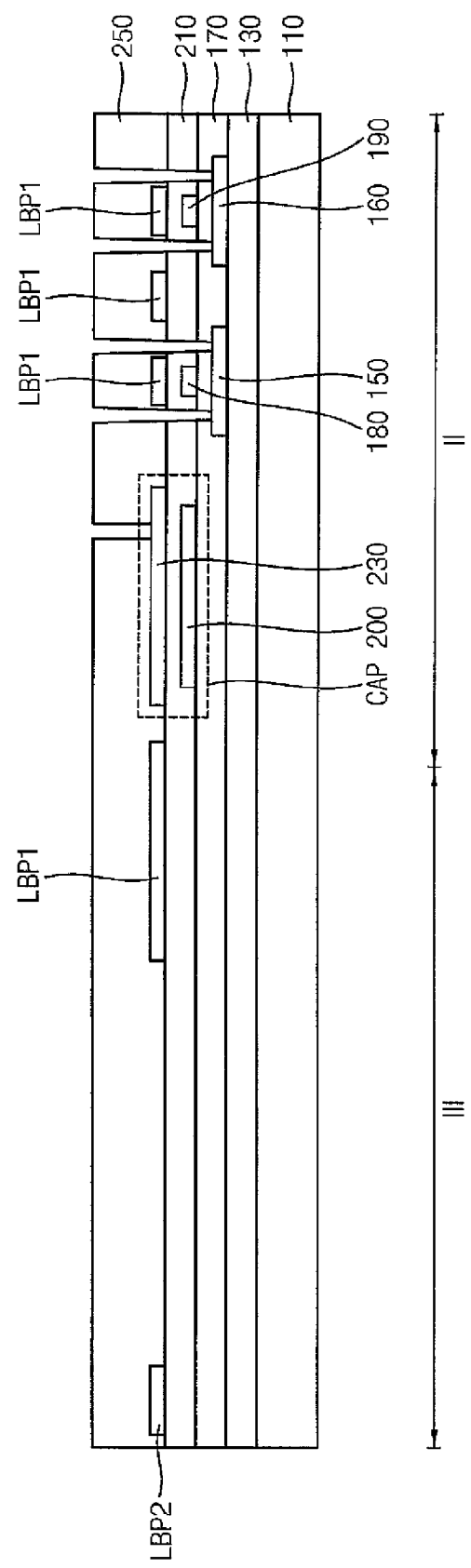

Referring to FIG. 7, a first insulating layer 250 is disposed on the substrate 110 on which the second capacitor electrode 230 is disposed. Therefore, a contact hole penetrating the first insulating layer 250 and a contact hole penetrating the first insulating layer 250, the gate insulating layer 210 and the insulating interlayer 170 are defined.

Figure 8:
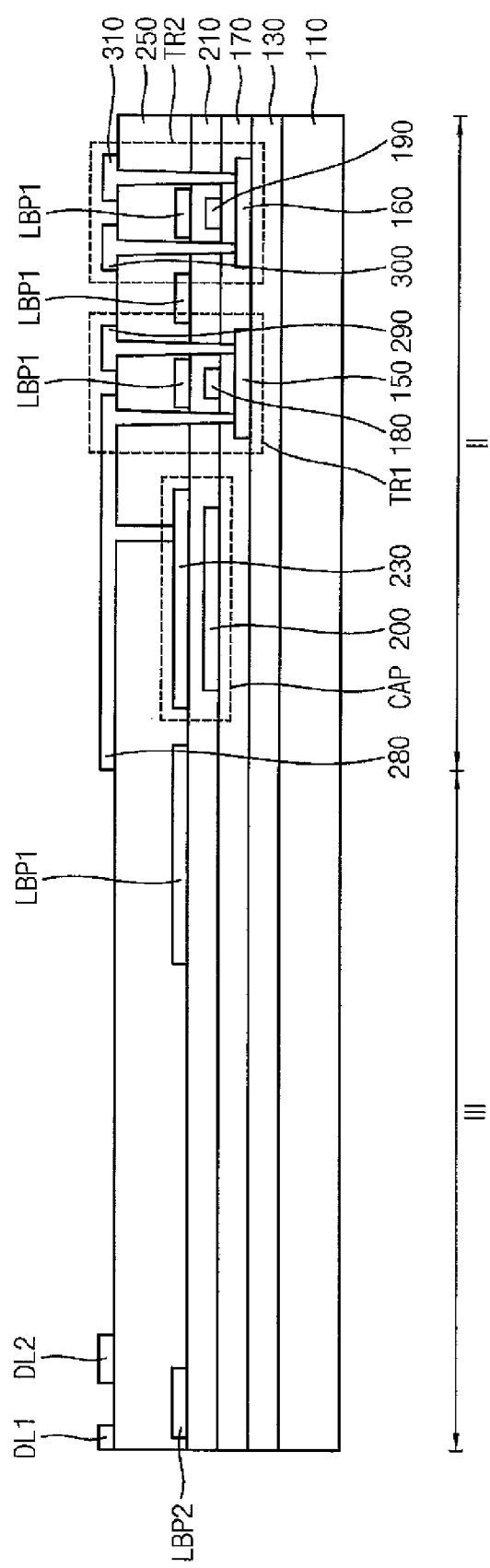

Referring to FIG. 8, a first source electrode, a first drain electrode 290, a second source electrode 300, a second drain electrode 310 and a power supply electrode 280 are provided.

The first source electrode and the first drain electrode 290 may be contacted to the first active pattern 150 by removing portions of the first insulating layer 250, the gate insulating layer 210, and the insulating interlayer 170. Each of the first source electrode and the first drain electrode 290 may include metal, alloy, metal nitride, conductive metal oxide, a transparent conductive material, etc., for example. These may be used alone or in a combination thereof.

The second source electrode 300 and the second drain electrode 310 may be contacted to the second active pattern 160 by removing portions of the first insulating layer 250, the gate insulating layer 210, and the insulating interlayer 170. Each of the second source electrode 300 and the second drain electrode 310 may include materials substantially the same as that of the first source electrode and the first drain electrode 290.

The power supply electrode 280 may be electrically contacted to the second capacitor electrode 230 by removing a portion of the first insulating layer 250, and may be electrically contacted to the first active pattern 150 by removing a portion of the first insulating layer 250, the gate insulating layer 210, and the insulating interlayer 170. The high power supply voltage applied to the power supply electrode 280 may be provide to the second capacitor electrode 230 and the first active pattern 150. The power supply electrode 280 may include materials substantially the same as that of the first drain electrode 290, the second source electrode 300, and the second drain electrode 310.

Figure 9:
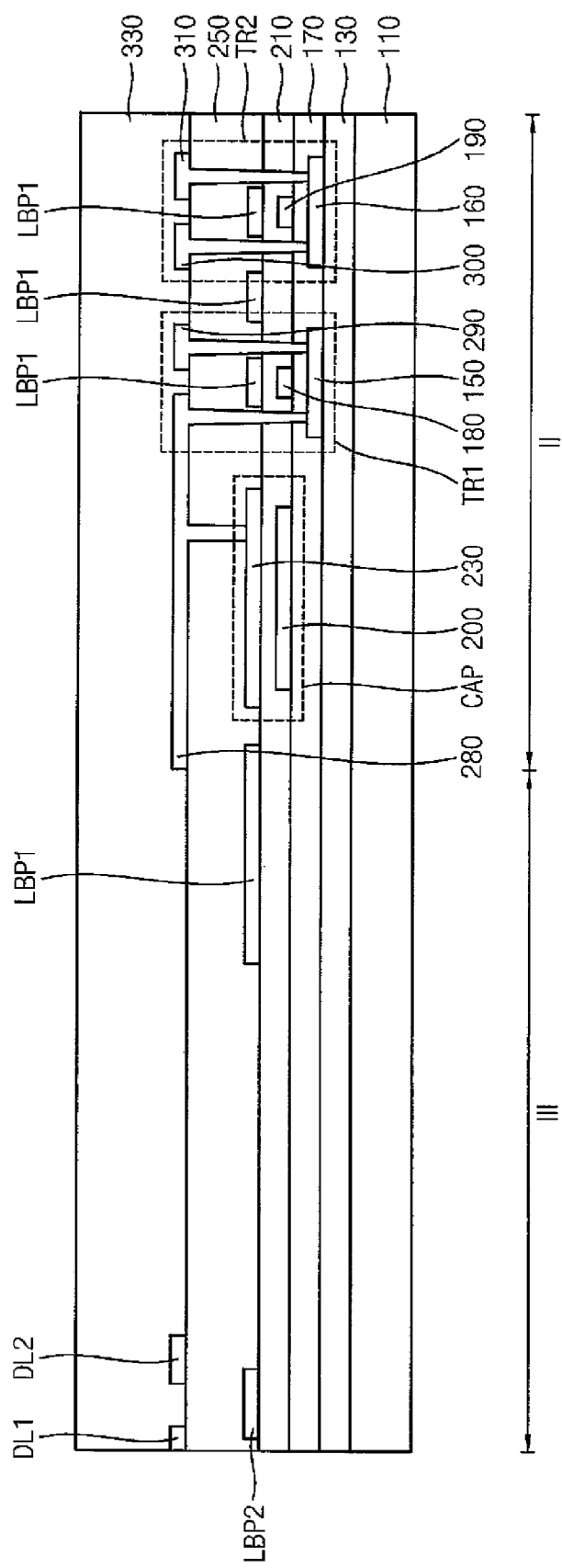

Referring to FIG. 9, a second insulating layer 330 is disposed on the substrate 110 on which the first source electrode, the first drain electrode 290, the second source electrode 300, the second drain electrode 310 and the power supply electrode 280 are provided.

The second insulating layer 330 may include an inorganic material. In an exemplary embodiment, the second insulating layer 330 may include a silicon compound such as silicon oxide (SiOx), silicon nitride (SiNx), silicon oxynitride (SiOxNy), silicon oxycarbide (SiOxCy), silicon carbonitride (SiCxNy), etc. These may be used alone or in a combination thereof. In some exemplary embodiments, the second insulating layer 330 may include an organic material. In an exemplary embodiment, the second insulating layer 330 may include polyimide-based resin, photoresist, acrylic-based resin, polyamide-based resin, siloxane-based resin, etc., for example. These may be used alone or in a combination thereof.

Figure 10:
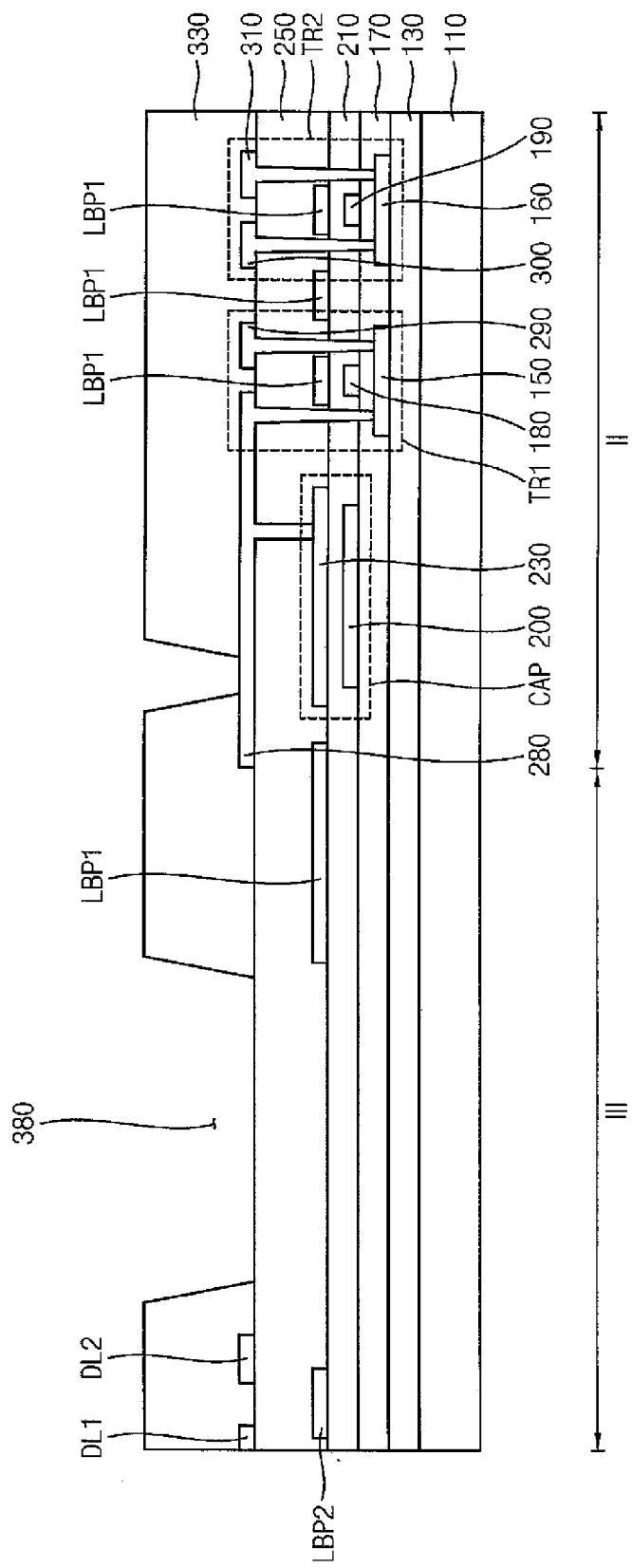

Referring to FIG. 10, the second insulating layer 330 is patterned to form a transparent window 380 and a contact hole.

The second insulating layer 330 may cover the first source electrode, the first drain electrode 290, the second source electrode 300, and the second drain electrode 310. The second insulating layer 330 may be disposed such that the second insulating layer 330 overlaps a portion of the power supply electrode 280. That is, at least a portion of the power supply electrode 280 may be exposed by the second insulating layer 330 disposed thereon.

The second insulating layer 330 may include an inorganic material. In an exemplary embodiment, the second insulating layer 330 may include a silicon compound such as silicon oxide (SiOx), silicon nitride (SiNx), silicon oxynitride (SiOxNy), silicon oxycarbide (SiOxCy), silicon carbonitride (SiCxNy), etc. These may be used alone or in a combination thereof. In exemplary embodiments, the second insulating layer 330 may include an organic material. In an exemplary embodiment, the second insulating layer 330 may include polyimide-based resin, photoresist, acrylic-based resin, polyamide-based resin, siloxane-based resin, etc., for example. These may be used alone or in a combination thereof.

Figure 11:
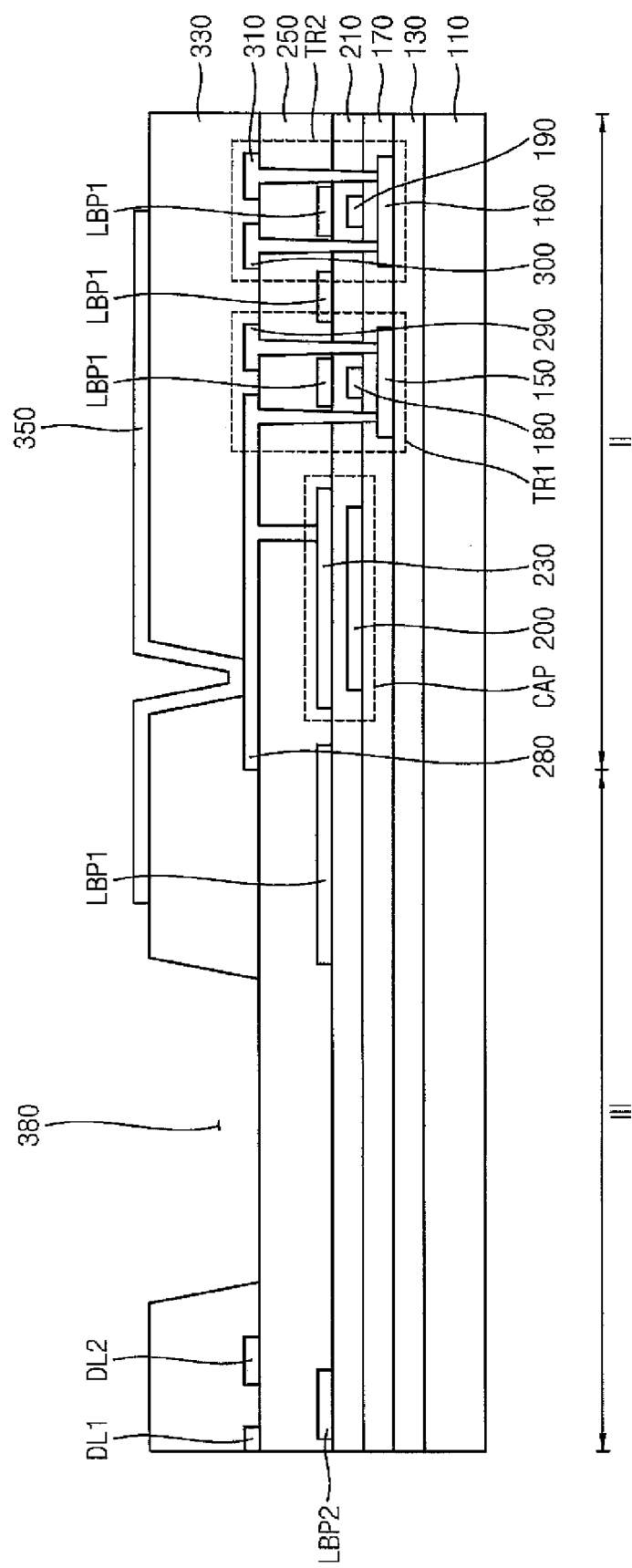

Referring to FIG. 11, a first electrode 350 is disposed on the second insulating layer 330.

The first electrode 350 may be disposed on a portion of the power supply electrode 280 and a portion of the second insulating layer 330 in the light-emitting region II. In exemplary embodiments, the first electrode 350 may be disposed as a substantially uniform thickness along upper surfaces of the power supply electrode 280 and the second insulating layer 330.

The first electrode 350 may include metal, alloy, metal nitride, conductive metal oxide, a transparent conductive material, etc., for example. In an exemplary embodiment, the first electrode 350 may include aluminum (Al), aluminum alloy, aluminum nitride (AlNx), silver (Ag), silver alloy, tungsten (W), tungsten nitride (WNx), copper (Cu), copper alloy, nickel (Ni), chrome (Cr), chrome nitride (CrNx), molybdenum (Mo), molybdenum alloy, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), ITO, stannum oxide (SnOx), indium oxide (InOx), gallium oxide (GaOx), IZO, etc., for example. These may be used alone or in a combination thereof.

Figure 12:
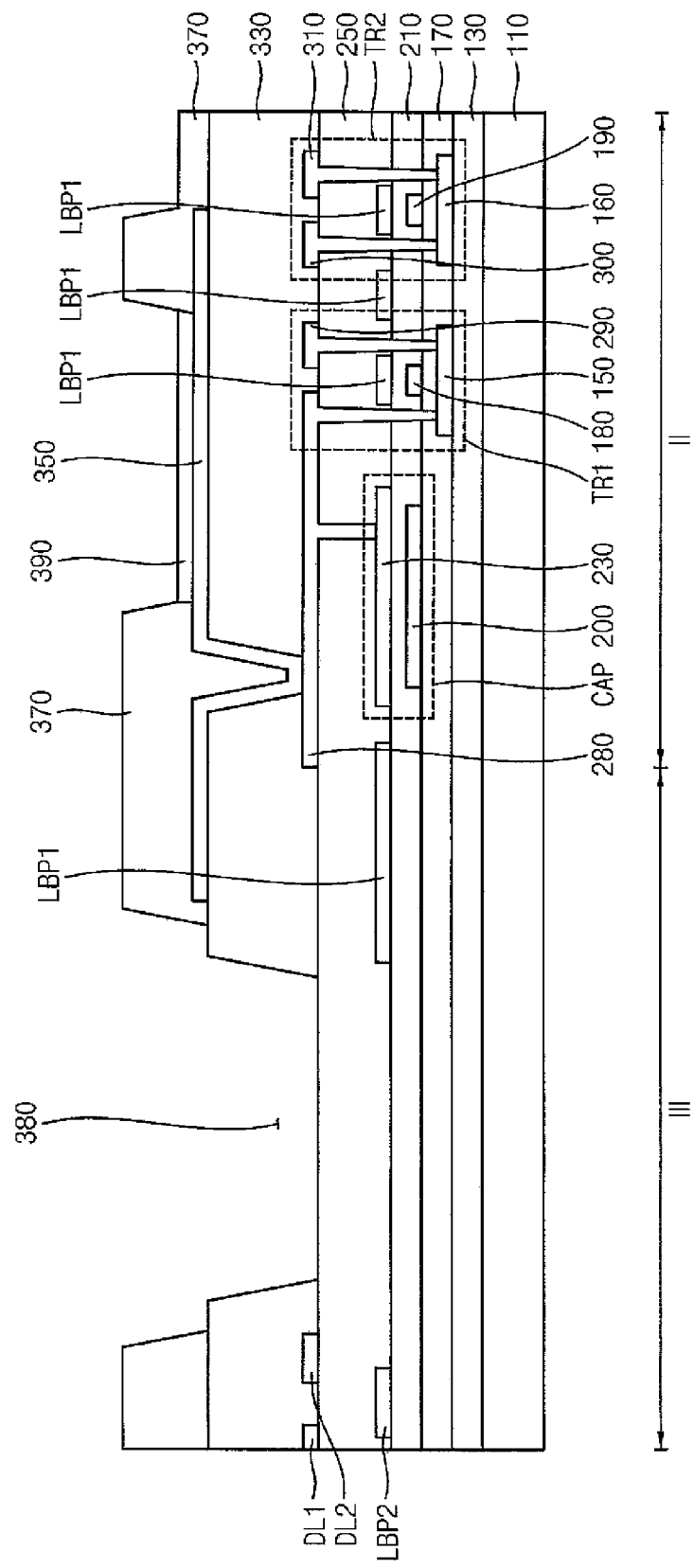

Referring to FIG. 12, a pixel defining layer 370 is disposed on the substrate 110 on which the first electrode 350 is disposed. Thereafter, an emission layer 390 is disposed on the first electrode 350 which is exposed via the first opening of the pixel defining layer 370.

The pixel defining layer 370 may be disposed on the first electrode 350 and a portion of the second insulating layer 330. A first opening and a second opening may be defined in the pixel defining layer 370. In the light-emitting region II, the first opening of the pixel defining layer 370 may be positioned in a portion of the first electrode 350 disposed on the second insulating layer 330. The emission layer 390 may be disposed in the first opening. In addition, the second opening of the pixel defining layer 370 may be positioned in the transparent region III. The second opening may be defined as the transparent window 380. The pixel defining layer 370 may include organic materials or inorganic materials. These may be used alone or in a combination thereof. In an exemplary embodiment, the pixel defining layer 370 may include materials substantially the same as that of the second insulating layer 330.

The emission layer 390 may be disposed on the first electrode 350 which is exposed via the first opening of the pixel defining layer 370. The emission layer 390 may be provided using light emitting materials capable of generating different colors of light (e.g., a red color of light, a blue color of light, and a green color of light). In an exemplary embodiment, the emission layer 390 may generally generate a white color of light by stacking a plurality of light emitting materials capable of generating different colors of light such as a red color of light, a green color of light, a blue color of light, etc.

Referring to FIG. 2, a second electrode 410 is disposed on the substrate 100 on which the pixel defining layer 370 is disposed.

The second electrode 410 may be disposed on the pixel defining layer 370, the emission layer 390, the first insulating layer 250 and the second insulating layer 330. In an exemplary embodiment, the second electrode 410 may be disposed as a substantially uniform thickness along upper surfaces of the pixel defining layer 370, the emission layer 390, the first insulating layer 250 and the second insulating layer 330. The second electrode 410 may be contacted to a portion of the first insulating layer 250 and the second insulating layer 330 via the transparent window 380, and may extend into the transparent region III. That is, the second electrode 410 may extend into the transparent window 380. In exemplary embodiments, the second electrode 410 may include a transparent conductive material. In an exemplary embodiment, the second electrode 410 may include ITO, SnOx, InOx, GaOx, IZO, etc., for example. Thus, the second electrode 410 positioned in the transparent region III may not substantially reduce a transmittivity of the transparent region III. In an exemplary embodiment, the second electrode 410 may include materials substantially the same as that of the first electrode 350.

Figure 13:
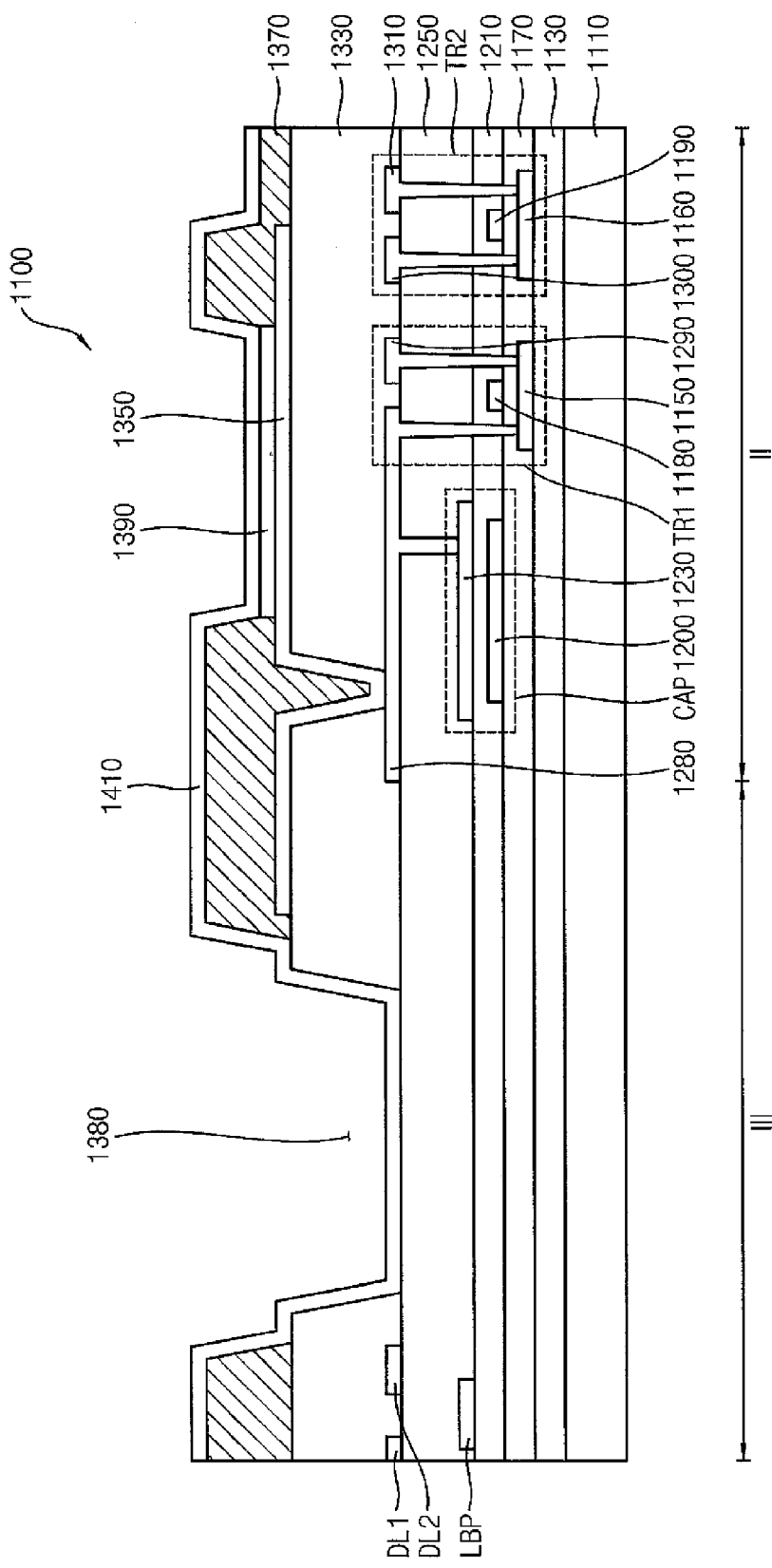
FIG. 13 is a plan view illustrating an exemplary embodiment of an OLED device according to the invention.
Figure 14:
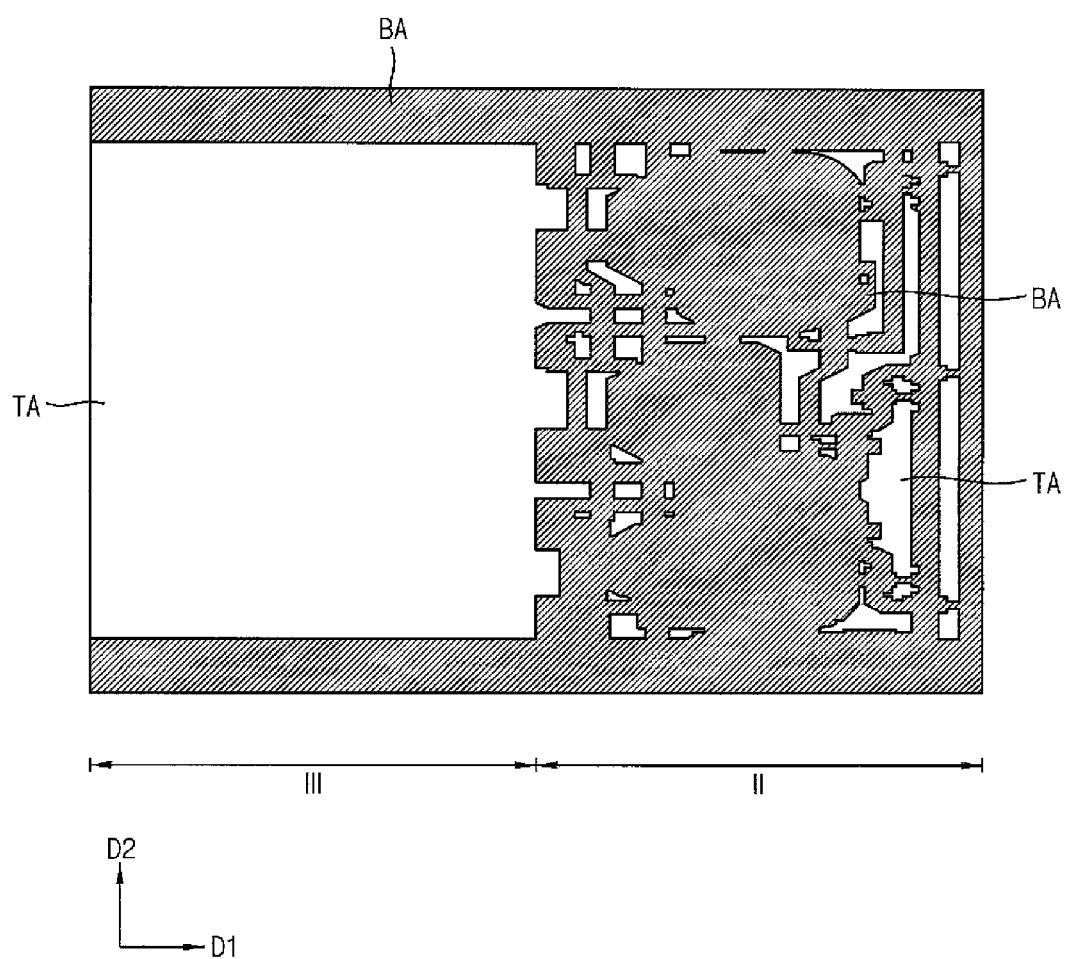
FIG. 14 is a plan view illustrating an exemplary embodiment of light transmission of an OLED device according to the invention.

FIG. 13 is a plan view illustrating an OLED device according to an exemplary embodiment of the invention. FIG. 14 is a plan view illustrating light transmission of an OLED device according to an exemplary embodiment of the invention.

The OLED device 1100 according to the exemplary embodiment is substantially same as the OLED device 100 of FIGS. 1 to 12 except for a light-blocking pattern LBP, and thus same reference numerals are used for same elements and repetitive explanation will be omitted.

Referring to FIG. 13, the OLED device 1100 may include a substrate 1110, a driving transistor TR1, a switching transistor TR2, a storage capacitor CAP, a power supply electrode 1280, a buffer layer 1130, an insulating interlayer 1170, a gate insulating layer 1210, a first insulating layer 1250, a second insulating layer 1330, a first electrode 1350, a pixel defining layer 1370, a transparent window 1380, an emission layer 1390, a second electrode 1410, etc., for example. In exemplary embodiments, the OLED device 1100 may include a light-emitting region II and a transparent region III. The driving transistor TR1, the switching transistor TR2, the storage capacitor CAP, the power supply electrode 1280, the second insulating layer 1330, the first electrode 1350, the emission layer 1390 may be positioned in the light-emitting region II. In addition, the transparent window 1380 may be positioned in the transparent region III. In an exemplary embodiment, an image may be displayed in the light-emitting region II, and objects or images located opposite to the OLED device 1100 may be transmitted in the transparent region III.

The light-blocking pattern LBP may be disposed on the gate insulating layer 1210. The light-blocking pattern LBP may be disposed on the same layer as the second capacitor electrode 1230. The light-blocking pattern LBP is insulated from the second capacitor electrode 1230. The light-blocking pattern LBP may include the same material as the second capacitor electrode 1230.

The light-blocking pattern LBP extends in a first direction D1. The light-blocking pattern LBP is disposed in the light-emitting region II and the transparent region III. The light-blocking pattern LBP overlaps data lines DL1 and DL2 electrically connected with a source electrode.

Referring to FIG. 14, state of light transmission of an OLED device according to an exemplary embodiment of the invention is illustrated.

The light-blocking pattern LBP is disposed in the light-emitting region II and the transparent region III. Thus, the light-blocking pattern LBP may form a light-blocking region BA in the light-emitting region II and a portion of the transparent region III. In addition, a light-blocking region BA in which a gate metal pattern including a gate electrode and a data metal pattern including a source electrode and a drain electrode are provided may be provided in the light-emitting region II. A region on which the light-blocking patterns are not disposed may be defined as a light-transmission region TA.

The gate metal pattern and the data metal pattern are not overlapped each other completely. Thus, tiny openings may be defined in a plan view. Accordingly, visibility of a display device may be decreased due to diffraction of light via the tiny openings.

However, an OLED device according to the invention includes light-blocking patterns disposed on the tiny openings. Thus, light transmitted via the tiny openings may be blocked. Accordingly, visibility of a display device may be improved.

In the exemplary embodiment, the first electrode 1350 may include opaque material. A width of a first direction D1 of the first electrode 1350 is wider than a width of a first direction D1 of the emission layer 1390 by more than about 5μ. The first electrode 1350 may block light not blocked by the light-blocking patterns. The first electrode 1350 may additionally block light of the light-emitting region II, and thus visibility of a display device may be improved.

FIGS. 15 to 23 are cross-sectional views illustrating a method of manufacturing the OLED device of FIG. 13.

Figure 15:
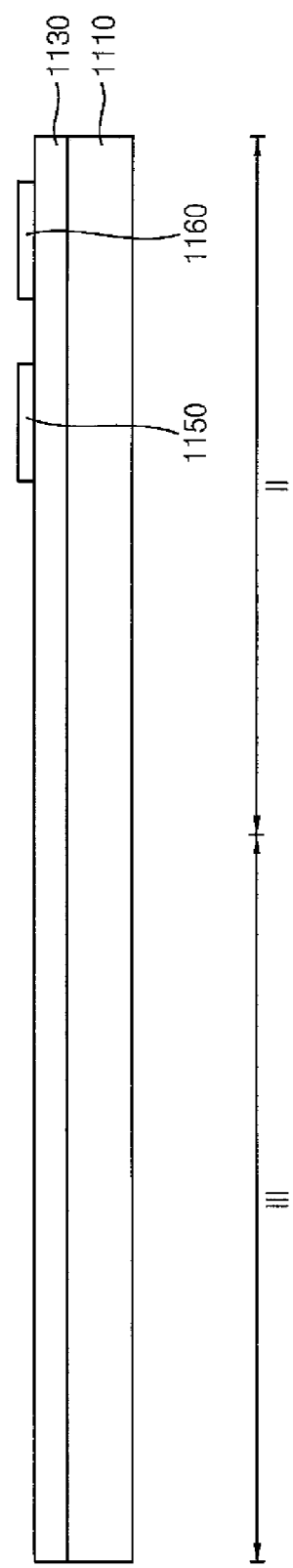
FIGS. 15 to 23 are cross-sectional views illustrating a method of manufacturing the OLED device of FIG. 13.

Referring to FIG. 15, a buffer layer 1130 is disposed on a substrate 1110. Thereafter, a first active pattern 1150 and a second active pattern 1160 are disposed on the buffer layer 1130.

The buffer layer 1130 may extend from the light-emitting region II into the transparent region III. The buffer layer 1130 may prevent the diffusion (e.g., an out gassing) of metal atoms and/or impurities from the substrate 1110. Additionally, the buffer layer 1130 may control a rate of a heat transfer in a crystallization process for forming a first active pattern 1150 and a second active pattern 1160, thereby obtaining substantially uniform the first and the second active patterns 1150 and 1160.

Furthermore, the buffer layer 1130 may improve a surface flatness of the substrate 1110 when a surface of the substrate 1110 is relatively irregular. In an exemplary embodiment, the buffer layer 1130 may include silicon nitride, silicon oxide, etc., for example. When the buffer layer 1130 includes the silicon oxide, an external light penetrated to the transparent region III of the OLED device 1100 may transmit the buffer layer 1130.

In exemplary embodiments, according to a type of the substrate 1110, at least two buffer layers may be provided on the substrate 1110, or the buffer layer may not be disposed.

The first and the second active patterns 1150 and 1160 may be positioned on the buffer layer 1130 on the light-emitting region II. The second active pattern 1160 may be spaced apart from the first active pattern 1150 along the first direction. Each of the first and the second active patterns 1150 and 1160 may include a material including silicon or oxide semiconductor.

Figure 16:
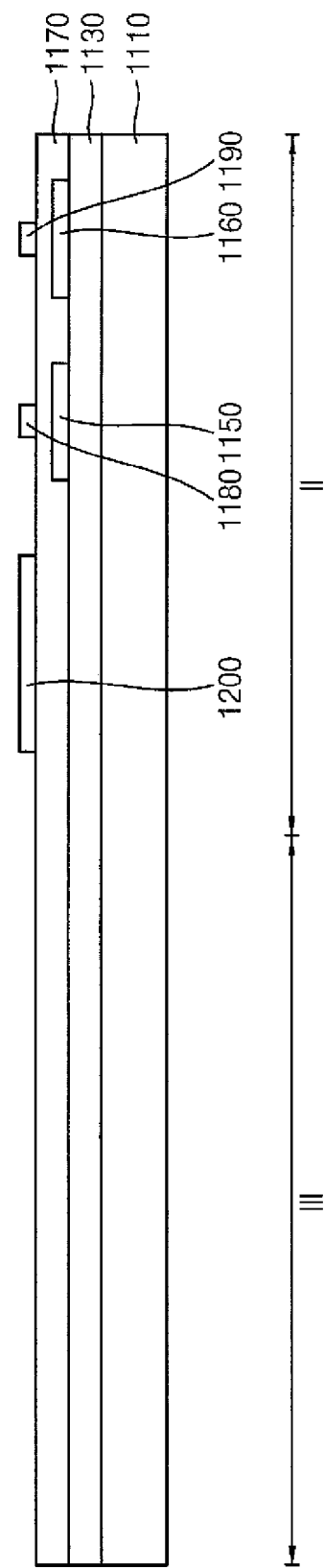

Referring to FIG. 16, a insulating interlayer 1170 is disposed on the substrate 1110 on which the buffer layer 1130 is disposed. Thereafter, a first gate electrode 1180, a second gate electrode 1190 and a first capacitor electrode 1200 are disposed on the insulating interlayer 1170.

The insulating interlayer 1170 may be disposed on the buffer layer 1130. The insulating interlayer 1170 may cover the first and second active patterns 1150 and 1160, and may extend into the transparent region III. In an exemplary embodiment, the insulating interlayer 1170 may include a silicon compound, a metal oxide, etc., for example. In exemplary embodiments, the insulating interlayer 1170 may include a silicon oxide. In an exemplary embodiment, the insulating interlayer 1170 may include a material substantially the same as that of the buffer layer 1130. In this case, as the insulating interlayer 1170 and the buffer layer 1130 may be provided as the same material in the transparent region III, the insulating interlayer 1170 and the buffer layer 1130 may have the same refractive index. Thus, a light transmittivity may be improved in the transparent region III.

The first gate electrode 1180 may be disposed on the insulating interlayer 1170 under which the first active pattern 1150 is positioned. The second gate electrode 1190 may be disposed on the insulating interlayer 1170 under which the second active pattern 1160 is positioned. Each of the first gate electrode 1180 and the second gate electrode 1190 may include metal, alloy, metal nitride, conductive metal oxide, a transparent conductive material, etc., for example.

The first capacitor electrode 1200 may be disposed on the insulating interlayer 1170. The first capacitor electrode 1200 may be spaced apart from the first gate electrode 1180 by predetermined distances. The first capacitor electrode 1200, the first gate electrode 1180, and the second gate electrode 1190 may include substantially the same material. In an exemplary embodiment, each of the first capacitor electrode 1200, the first gate electrode 1180, and the second gate electrode 1190 may include different materials.

Figure 17:
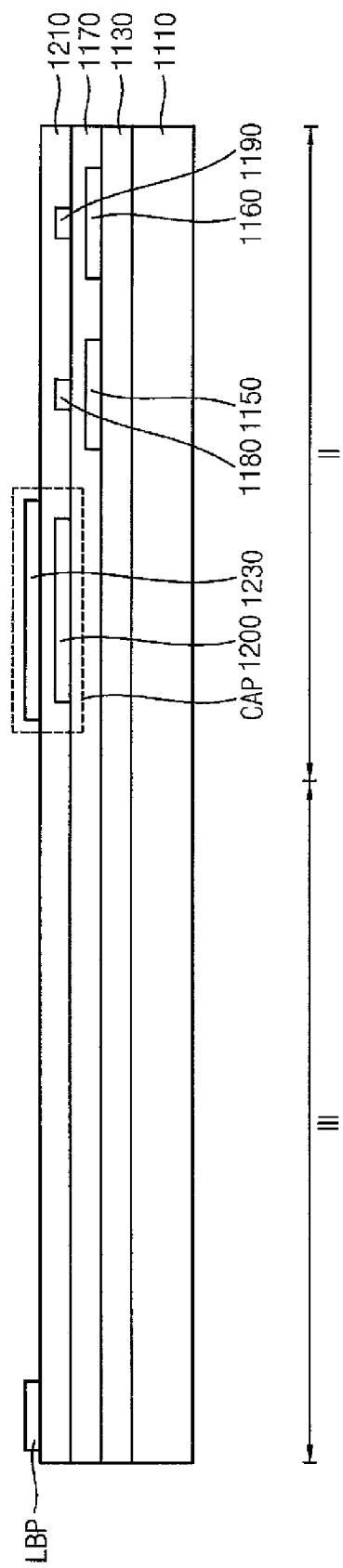

Referring to FIG. 17, a gate insulating layer 1210 is disposed on the substrate 1110 on which the first gate electrode 1180, the second gate electrode 1190 and the first capacitor electrode 1200 are disposed. Thereafter, a second capacitor electrode 1230 and a light-blocking pattern LBP are disposed on the gate insulating layer 1210.

The gate insulating layer 1210 may be disposed on the insulating interlayer 1170, the first capacitor electrode 1200, the first gate electrode 1180, and the second gate electrode 1190. The gate insulating layer 1210 may cover the first capacitor electrode 1200, the first gate electrode 1180, and the second gate electrode 1190, and may extend into the transparent region III. In an exemplary embodiment, the gate insulating layer 1210 may include a silicon compound, a metal oxide, etc., for example. In exemplary embodiments, the gate insulating layer 1210 may include a silicon oxide. In an exemplary embodiment, the gate insulating layer 1210 may include a material substantially the same as that of the buffer layer 1130 and the insulating interlayer 1170. In this case, as the gate insulating layer 1210, the insulating interlayer 1170 and the buffer layer 1130 may be provided as the same material in the transparent region III, the gate insulating layer 1210, the insulating interlayer 1170 and the buffer layer 1130 may have the same refractive index. Thus, a light transmittivity may be improved in the transparent region III.

The second capacitor electrode 1230 may be disposed on the gate insulating layer 1210 under which the first capacitor electrode 1200 is positioned. The second capacitor electrode 1230 may include a material substantially the same that of the first gate electrode 1180, the second gate electrode 1190, and the first capacitor electrode 1200. In an exemplary embodiment, each of the second capacitor electrode 1230, the first gate electrode 1180, the second gate electrode 1190, and the first capacitor electrode 1200 may include different materials.

The light-blocking pattern LBP may be disposed on the same layer as the second capacitor electrode 230. The light-blocking pattern LBP is insulated from the second capacitor electrode 230. The light-blocking pattern LBP may include the same material as the second capacitor electrode 230.

The light-blocking pattern LBP extends in a first direction D1. The light-blocking pattern LBP is disposed in the light-emitting region II and the transparent region III. The light-blocking pattern LBP overlaps data lines DL1 and DL2 electrically connected with a source electrode.

Figure 18:
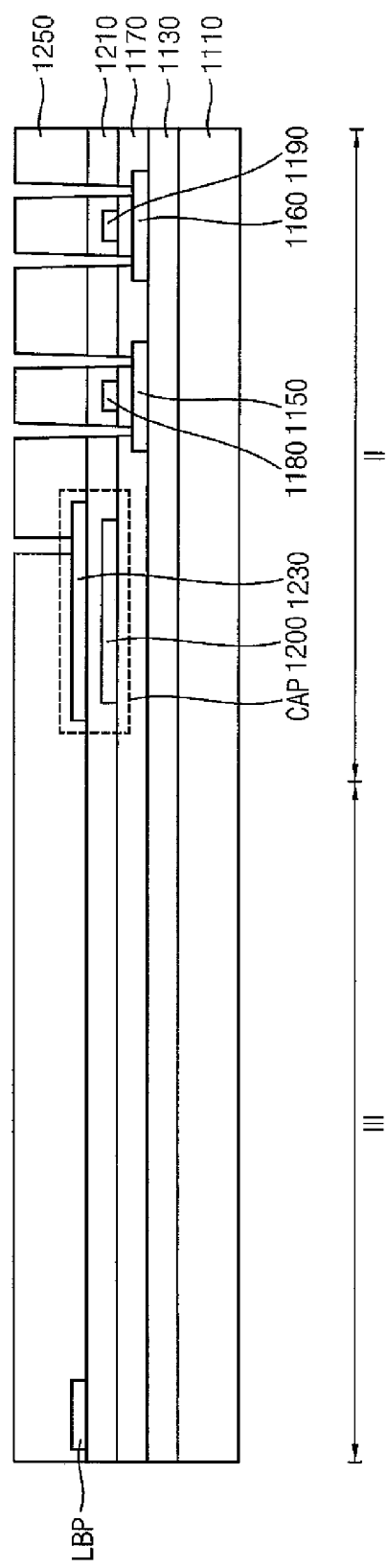

Referring to FIG. 18, a first insulating layer 1250 is disposed on the substrate 1110 on which the second capacitor electrode 1230 is disposed. Therefore, a contact hole penetrating the first insulating layer 1250 and a contact hole penetrating the first insulating layer 1250, the gate insulating layer 1210 and the insulating interlayer 1170 are defined.

Figure 19:
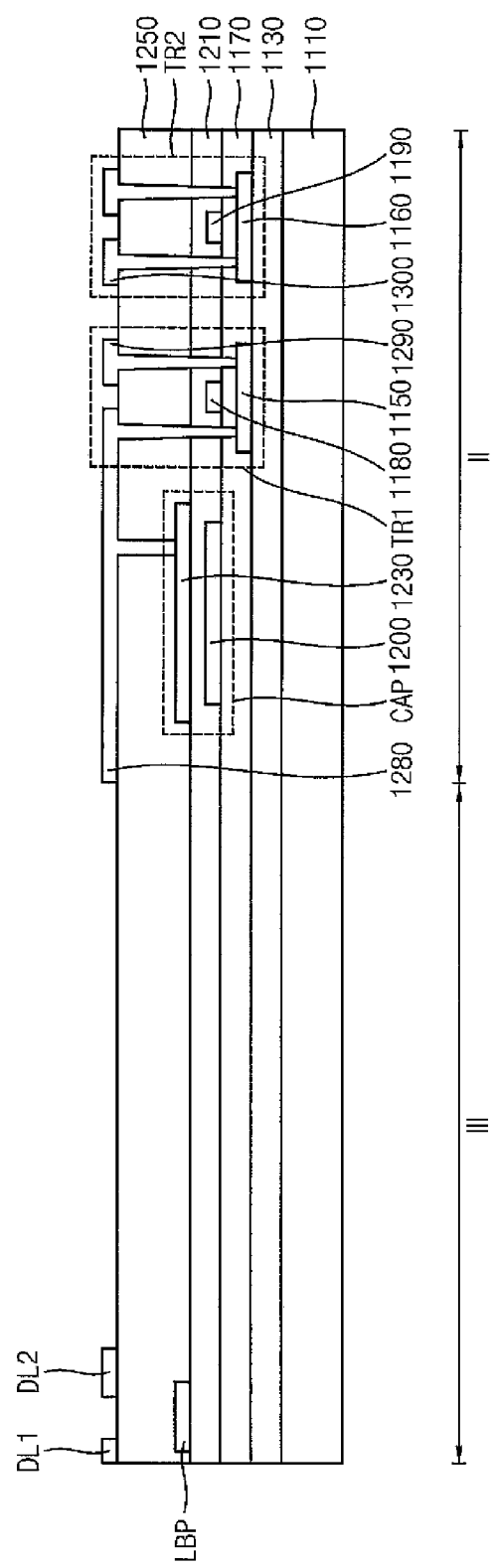

Referring to FIG. 19, a first source electrode, a first drain electrode 1290, a second source electrode 1300, a second drain electrode 1310 and a power supply electrode 1280 are provided.

The first source electrode and the first drain electrode 1290 may be contacted to the first active pattern 1150 by removing portions of the first insulating layer 1250, the gate insulating layer 1210, and the insulating interlayer 1170. Each of the first source electrode and the first drain electrode 1290 may include metal, alloy, metal nitride, conductive metal oxide, a transparent conductive material, etc., for example. These may be used alone or in a combination thereof.

The second source electrode 1300 and the second drain electrode 1310 may be contacted to the second active pattern 1160 by removing portions of the first insulating layer 1250, the gate insulating layer 1210, and the insulating interlayer 1170. Each of the second source electrode 1300 and the second drain electrode 1310 may include materials substantially the same as that of the first source electrode and the first drain electrode 1290.

The power supply electrode 1280 may be electrically contacted to the second capacitor electrode 1230 by removing a portion of the first insulating layer 1250, and may be electrically contacted to the first active pattern 1150 by removing a portion of the first insulating layer 1250, the gate insulating layer 1210, and the insulating interlayer 1170. The high power supply voltage applied to the power supply electrode 1280 may be provide to the second capacitor electrode 1230 and the first active pattern 1150. The power supply electrode 1280 may include materials substantially the same as that of the first drain electrode 1290, the second source electrode 1300, and the second drain electrode 1310.

Figure 20:
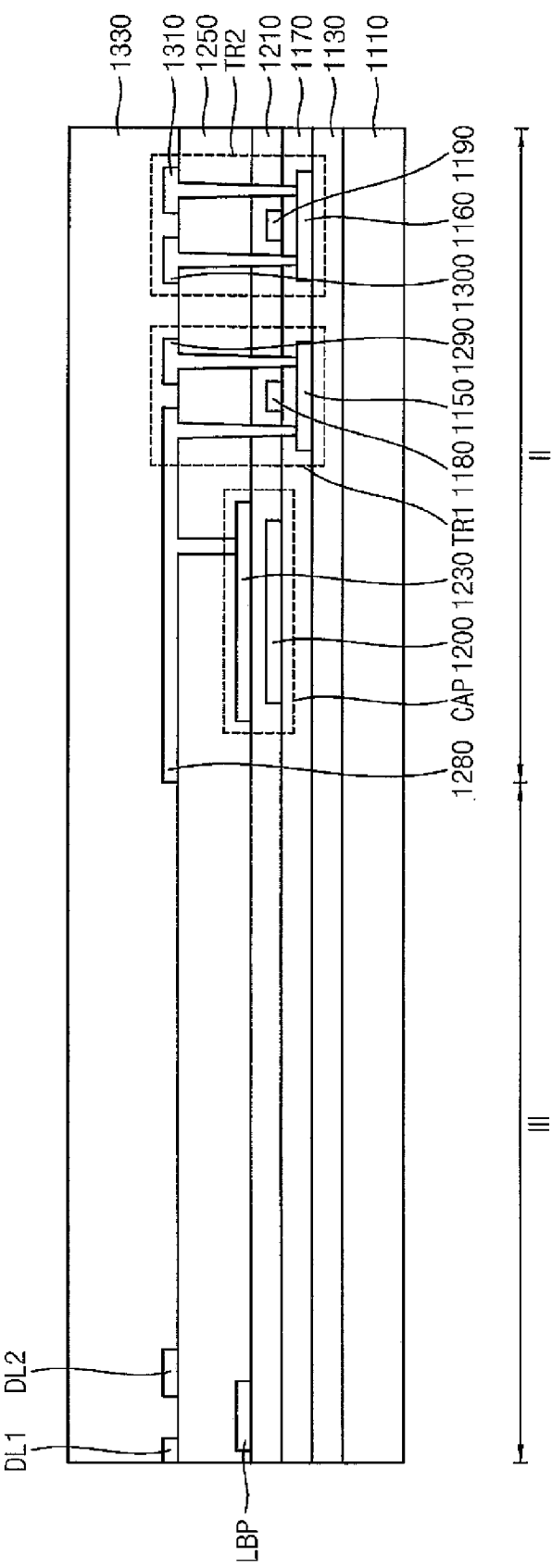

Referring to FIG. 20, a second insulating layer 1330 is disposed on the substrate 1110 on which the first source electrode, the first drain electrode 1290, the second source electrode 1300, the second drain electrode 1310 and the power supply electrode 1280 are disposed.

The second insulating layer 1330 may include an inorganic material. In an exemplary embodiment, the second insulating layer 1330 may include a silicon compound such as silicon oxide (SiOx), silicon nitride (SiNx), silicon oxynitride (SiOxNy), silicon oxycarbide (SiOxCy), silicon carbonitride (SiCxNy), etc. These may be used alone or in a combination thereof. In exemplary embodiments, the second insulating layer 1330 may include an organic material. In an exemplary embodiment, the second insulating layer 1330 may include polyimide-based resin, photoresist, acrylic-based resin, polyamide-based resin, siloxane-based resin, etc., for example. These may be used alone or in a combination thereof.

Figure 21:
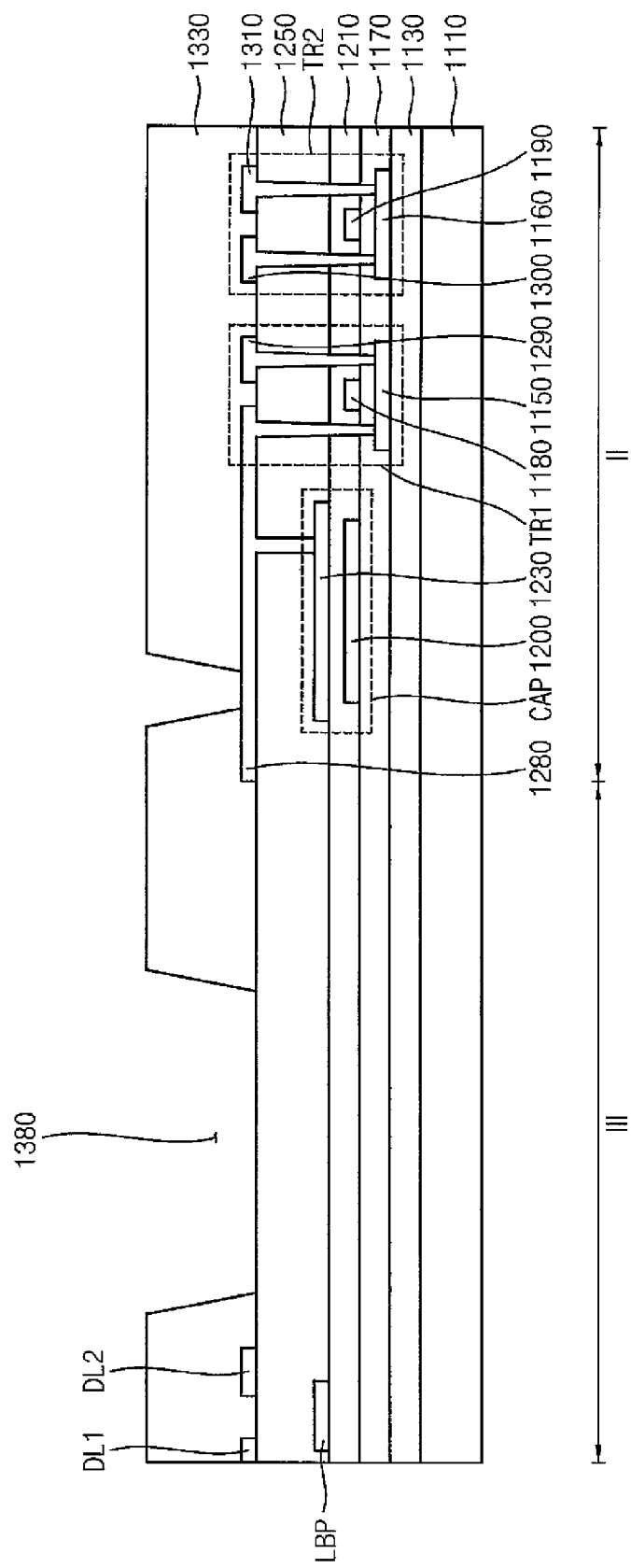

Referring to FIG. 21, the second insulating layer 1330 is patterned to form a transparent window 1380 and a contact hole.

The second insulating layer 1330 may cover the first source electrode, the first drain electrode 1290, the second source electrode 1300, and the second drain electrode 1310. The second insulating layer 1330 may be disposed such that the second insulating layer 1330 overlaps a portion of the power supply electrode 1280. That is, at least a portion of the power supply electrode 1280 may be exposed by the second insulating layer 1330 disposed thereon.

The second insulating layer 1330 may include an inorganic material. In an exemplary embodiment, the second insulating layer 1330 may include a silicon compound such as silicon oxide (SiOx), silicon nitride (SiNx), silicon oxynitride (SiOxNy), silicon oxycarbide (SiOxCy), silicon carbonitride (SiCxNy), etc. These may be used alone or in a combination thereof. In exemplary embodiments, the second insulating layer 1330 may include an organic material. In an exemplary embodiment, the second insulating layer 1330 may include polyimide-based resin, photoresist, acrylic-based resin, polyamide-based resin, siloxane-based resin, etc., for example. These may be used alone or in a combination thereof.

Figure 22:
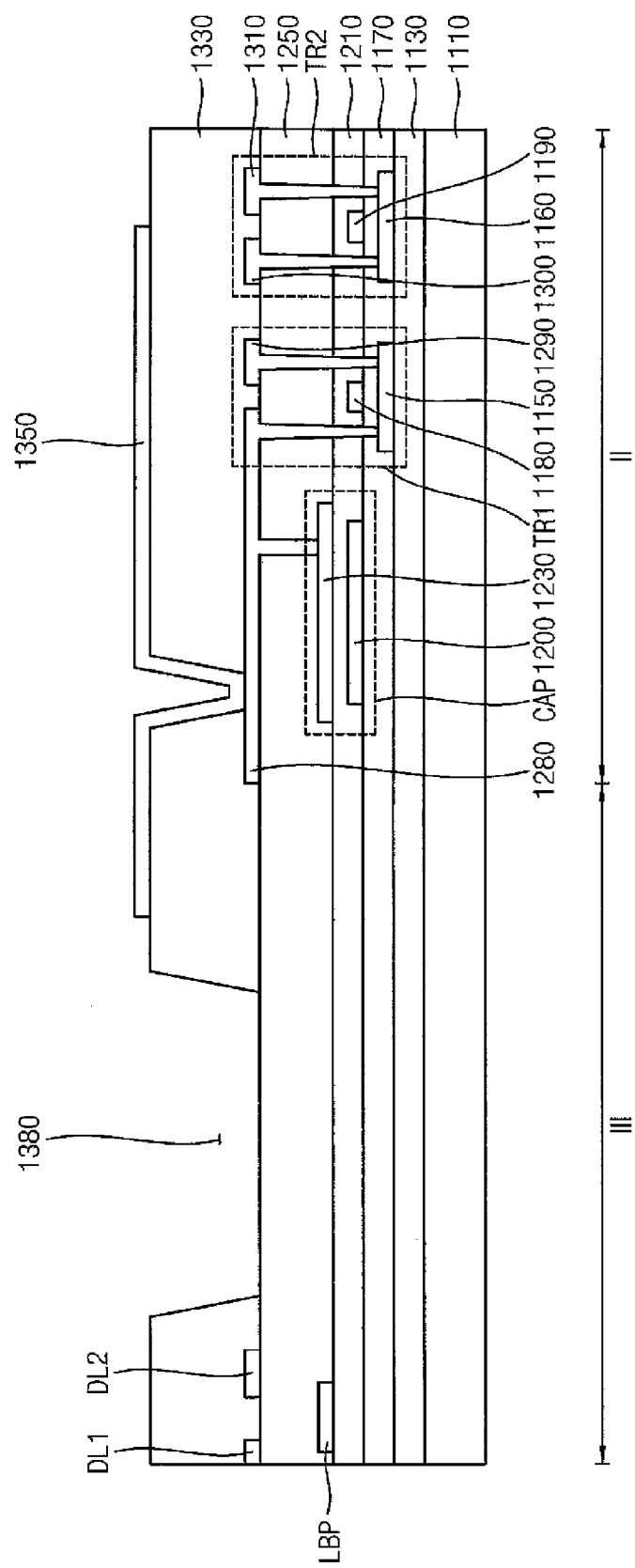

Referring to FIG. 22, a first electrode 1350 is disposed on the second insulating layer 1330.

The first electrode 1350 may be disposed on a portion of the power supply electrode 1280 and a portion of the second insulating layer 1330 in the light-emitting region II. In exemplary embodiments, the first electrode 1350 may be disposed as a substantially uniform thickness along upper surfaces of the power supply electrode 1280 and the second insulating layer 1330.

The first electrode 1350 may include metal, alloy, metal nitride, conductive metal oxide, a transparent conductive material, etc., for example. In an exemplary embodiment, the first electrode 1350 may include aluminum (Al), aluminum alloy, aluminum nitride (AlNx), silver (Ag), silver alloy, tungsten (W), tungsten nitride (WNx), copper (Cu), copper alloy, nickel (Ni), chrome (Cr), chrome nitride (CrNx), molybdenum (Mo), molybdenum alloy, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), ITO, stannum oxide (SnOx), indium oxide (InOx), gallium oxide (GaOx), IZO, etc., for example. These may be used alone or in a combination thereof.

Figure 23:
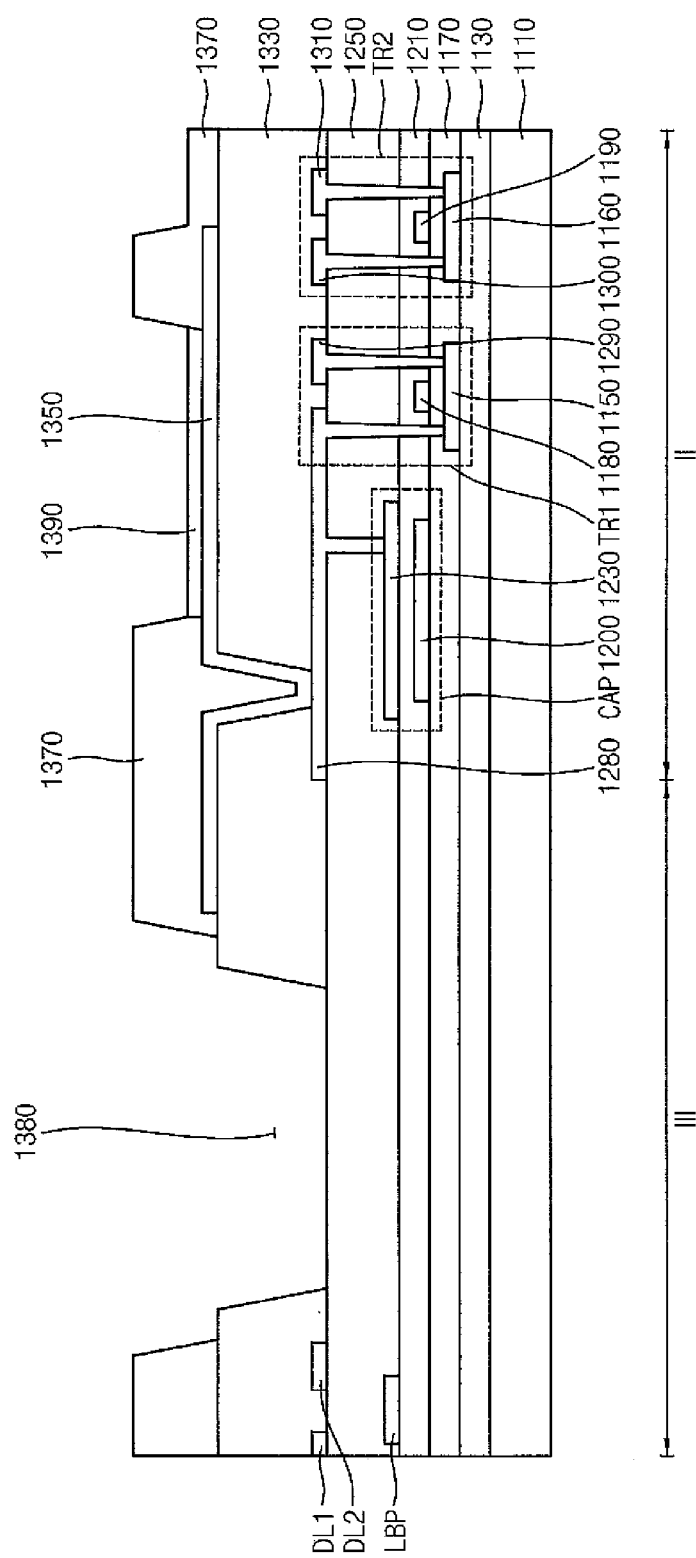

Referring to FIG. 23, a pixel defining layer 1370 is disposed on the substrate 1110 on which the first electrode 1350 is disposed. Thereafter, an emission layer 1390 is disposed on the first electrode 1350 which is exposed via the first opening of the pixel defining layer 1370.

The pixel defining layer 1370 may be disposed on the first electrode 1350 and a portion of the second insulating layer 1330. A first opening and a second opening may be defined in the pixel defining layer 1370. In the light-emitting region II, the first opening of the pixel defining layer 1370 may be positioned in a portion of the first electrode 1350 disposed on the second insulating layer 1330. The emission layer 1390 may be disposed in the first opening. In addition, the second opening of the pixel defining layer 1370 may be positioned in the transparent region III. The second opening may be defined as the transparent window 1380. The pixel defining layer 1370 may include organic materials or inorganic materials. These may be used alone or in a combination thereof. In an exemplary embodiment, the pixel defining layer 1370 may include materials substantially the same as that of the second insulating layer 1330.

The emission layer 1390 may be disposed on the first electrode 1350 which is exposed via the first opening of the pixel defining layer 1370. The emission layer 1390 may be provided using light emitting materials capable of generating different colors of light (e.g., a red color of light, a blue color of light, and a green color of light). In an exemplary embodiment, the emission layer 1390 may generally generate a white color of light by stacking a plurality of light emitting materials capable of generating different colors of light such as a red color of light, a green color of light, a blue color of light, etc. A width of a first direction D1 of the first electrode 1350 is wider than a width of a first direction D1 of the emission layer 1390 by more than about 5μ. The first electrode 1350 may block light not blocked by the light-blocking patterns. The first electrode 1350 may additionally block light of the light-emitting region II, and thus visibility of a display device may be improved.

Referring to FIG. 13, a second electrode 1410 is disposed on the substrate 1100 on which the pixel defining layer 1370 is disposed.

The second electrode 1410 may be disposed on the pixel defining layer 1370, the emission layer 1390, the first insulating layer 1250 and the second insulating layer 1330. In an exemplary embodiment, the second electrode 1410 may be disposed as a substantially uniform thickness along upper surfaces of the pixel defining layer 1370, the emission layer 1390, the first insulating layer 1250 and the second insulating layer 1330. The second electrode 1410 may be contacted to a portion of the first insulating layer 1250 the second insulating layer 1330 via the via the transparent window 1380, and may extend into the transparent region III. That is, the second electrode 1410 may extend into the transparent window 1380. In exemplary embodiments, the second electrode 1410 may include a transparent conductive material. In an exemplary embodiment, the second electrode 1410 may include ITO, SnOx, InOx, GaOx, IZO, etc., for example. Thus, the second electrode 1410 positioned in the transparent region III may not substantially reduce a transmittivity of the transparent region III. In an exemplary embodiment, the second electrode 1410 may include materials substantially the same as that of the first electrode 1350.

Figure 24:
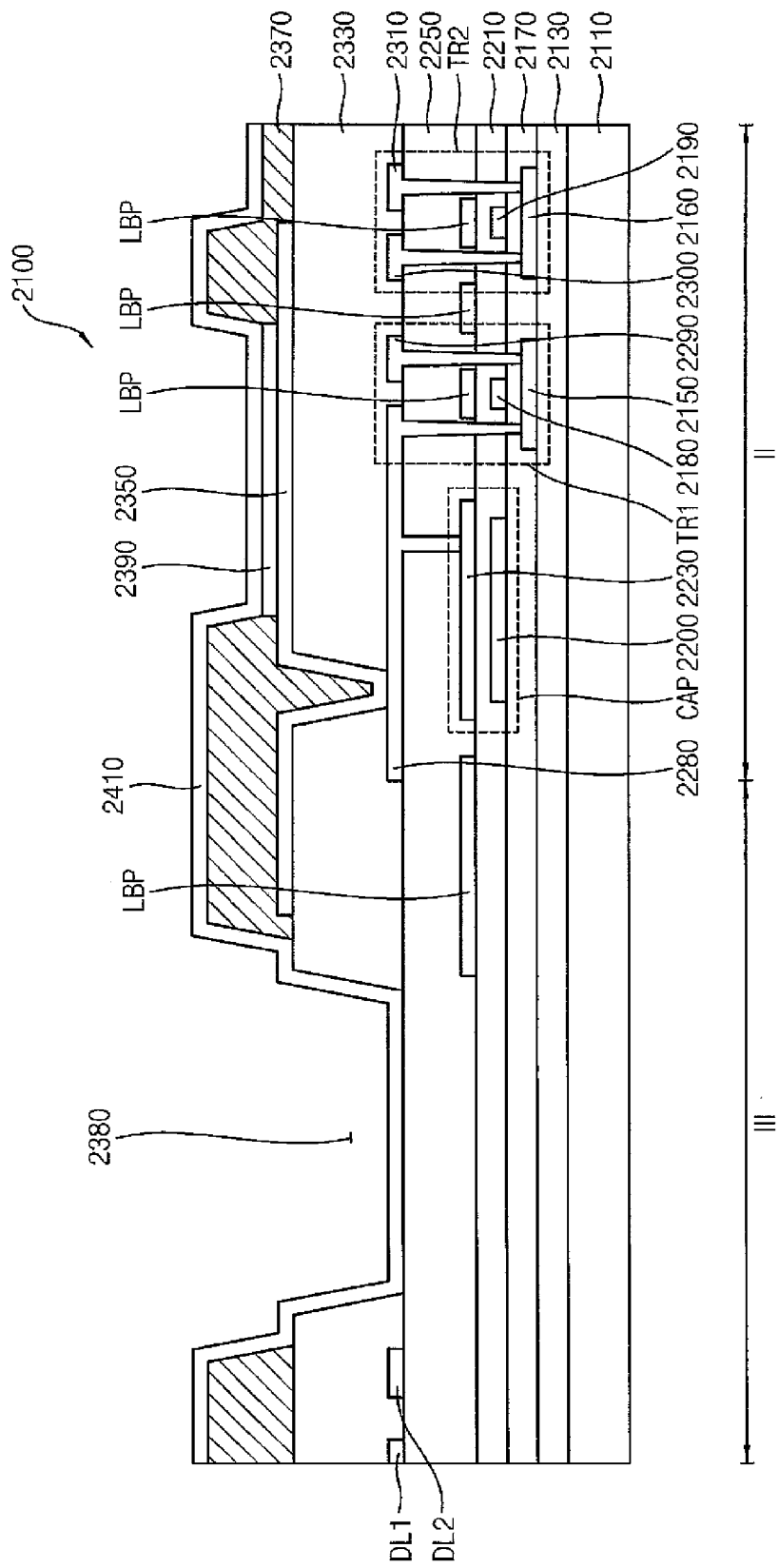
FIG. 24 is a plan view illustrating an exemplary embodiment of an OLED device according to the invention.
Figure 25:
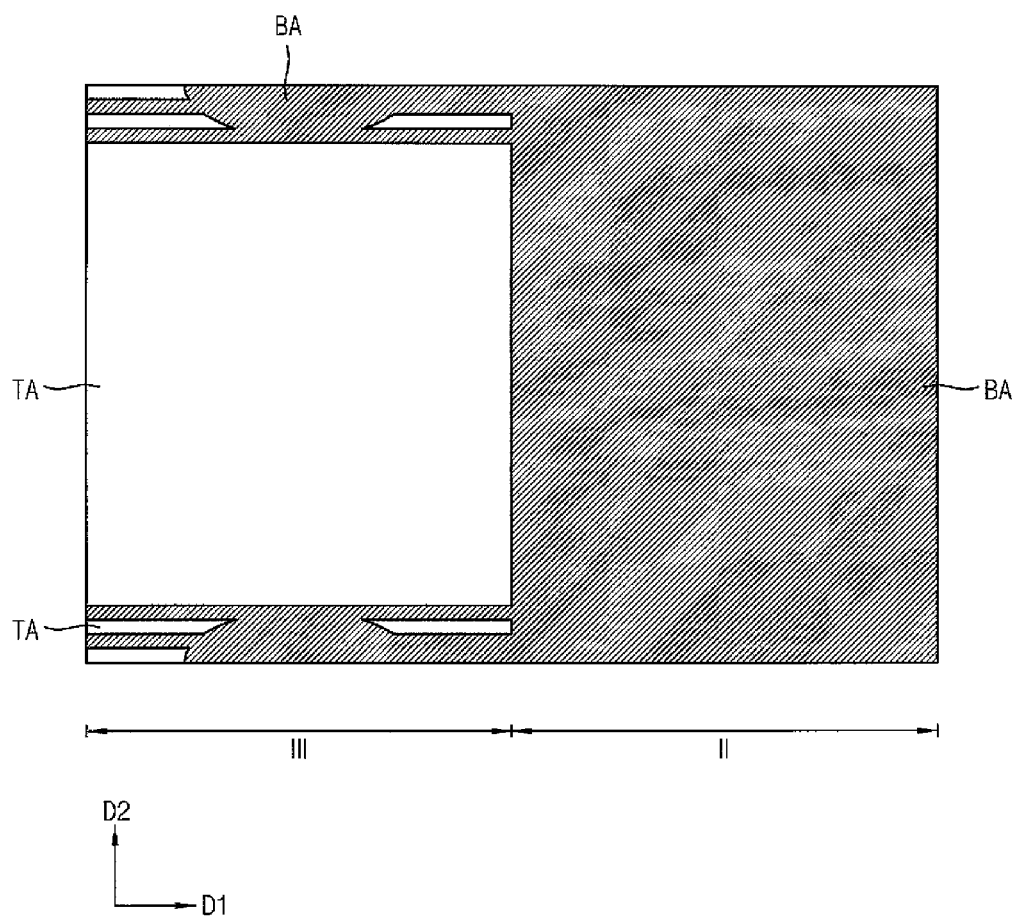
FIG. 25 is a plan view illustrating an exemplary embodiment of light transmission of an OLED device according to the invention.

FIG. 24 is a plan view illustrating an OLED device according to an exemplary embodiment of the invention. FIG. 25 is a plan view illustrating light transmission of an OLED device according to an exemplary embodiment of the invention.

The OLED device 2100 according to the exemplary embodiment is substantially same as the OLED device 100 of FIGS. 1 to 12 except for a light-blocking pattern LBP, and thus same reference numerals are used for same elements and repetitive explanation will be omitted.

Referring to FIGS. 1 and 24, the OLED device 2100 may include a substrate 2110, a driving transistor TR1, a switching transistor TR2, a storage capacitor CAP, a power supply electrode 2280, a buffer layer 2130, an insulating interlayer 2170, a gate insulating layer 2210, a first insulating layer 2250, a second insulating layer 2330, a first electrode 2350, a pixel defining layer 2370, a transparent window 2380, an emission layer 2390, a second electrode 2410, etc., for example. In exemplary embodiments, the OLED device 2100 may include a light-emitting region II and a transparent region III. The driving transistor TR1, the switching transistor TR2, the storage capacitor CAP, the power supply electrode 2280, the second insulating layer 2330, the first electrode 2350, the emission layer 2390 may be positioned in the light-emitting region II. In addition, the transparent window 2380 may be positioned in the transparent region III. In an exemplary embodiment, an image may be displayed in the light-emitting region II, and objects or images located opposite to the OLED device 2100 may be transmitted in the transparent region III.

The light-blocking pattern LBP may be disposed on the gate insulating layer 2210. The light-blocking pattern LBP may be disposed on the same layer as the second capacitor electrode 2230. The light-blocking pattern LBP is insulated from the second capacitor electrode 2230. The light-blocking pattern LBP may include the same material as the second capacitor electrode 2230.

The light-blocking pattern LBP is disposed in the light-emitting region II. The light-blocking pattern LBP partially overlaps the first gate electrode 180, the second gate electrode 2190, the first source electrode, the second source electrode 2300, the first drain electrode 2290 and the second drain electrode 2310. The light-blocking pattern LBP may be disposed in a region on which the first gate electrode 2180, the second gate electrode 2190, the first source electrode, the second source electrode 2300, the first drain electrode 2290 and the second drain electrode 2310 are not disposed in a plan view. That is, the light-blocking pattern LBP is disposed in a region on which a gate metal pattern including a gate electrode and a data metal pattern including a source electrode, a drain electrode and a data line are not disposed in a plan view.

Referring to FIG. 25, state of light transmission of an OLED device according to an exemplary embodiment of the invention is illustrated.

The light-blocking pattern LBP is disposed in the light-emitting region II. Thus, the light-blocking pattern LBP may form a light-blocking region BA in the light-emitting region II. A region on which the light-blocking pattern LBP are not disposed may be defined as a light-transmission region TA.

The gate metal pattern and the data metal pattern are not overlapped each other completely. Thus, tiny openings may be defined in a plan view. Accordingly, visibility of a display device may be decreased due to diffraction of light via the tiny openings.

However, an OLED device according to the invention includes light-blocking patterns disposed on the tiny openings. Thus, light transmitted via the tiny openings may be blocked. Accordingly, visibility of a display device may be improved.

In the exemplary embodiment, the first electrode 2350 may include opaque material. A width of a first direction D1 of the first electrode 2350 is wider than a width of a first direction D1 of the emission layer 2390 by more than about 5μ. The first electrode 2350 may block light not blocked by the light-blocking patterns. The first electrode 2350 may additionally block light of the light-emitting region II, and thus visibility of a display device may be improved.

FIGS. 26 to 34 are cross-sectional views illustrating a method of manufacturing the OLED device of FIG. 24.

Figure 26:
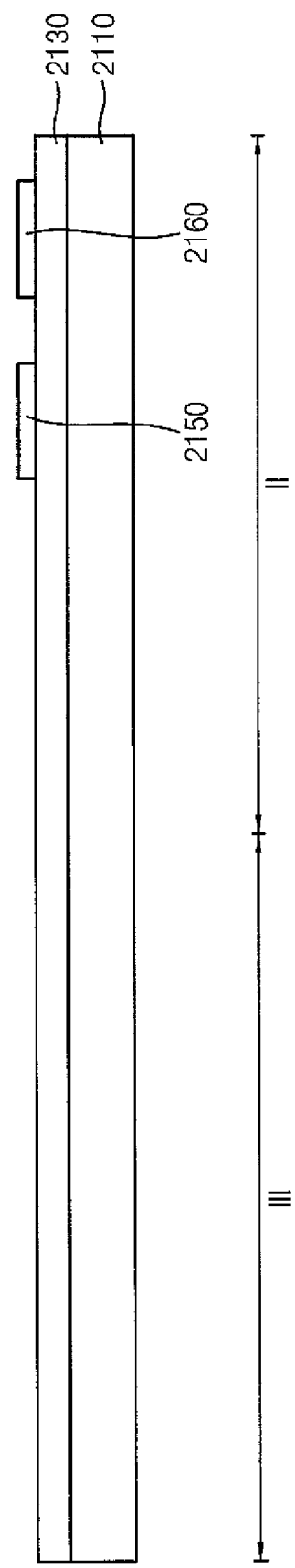
FIGS. 26 to 34 are cross-sectional views illustrating a method of manufacturing the OLED device of FIG. 24.

Referring to FIG. 26, a buffer layer 2130 is disposed on a substrate 2110. Thereafter, a first active pattern 2150 and a second active pattern 2160 are disposed on the buffer layer 2130.

The buffer layer 2130 may extend from the light-emitting region II into the transparent region III. The buffer layer 2130 may prevent the diffusion (e.g., an out gassing) of metal atoms and/or impurities from the substrate 2110. Additionally, the buffer layer 2130 may control a rate of a heat transfer in a crystallization process for forming a first active pattern 2150 and a second active pattern 2160, thereby obtaining substantially uniform the first and the second active patterns 2150 and 2160.

Furthermore, the buffer layer 2130 may improve a surface flatness of the substrate 2110 when a surface of the substrate 2110 is relatively irregular. In an exemplary embodiment, the buffer layer 2130 may include silicon nitride, silicon oxide, etc., for example. When the buffer layer 2130 includes the silicon oxide, an external light penetrated to the transparent region III of the OLED device 2100 may transmit the buffer layer 2130.

In exemplary embodiments, according to a type of the substrate 2110, at least two buffer layers may be provided on the substrate 2110, or the buffer layer may not be disposed.

The first and the second active patterns 2150 and 2160 may be positioned on the buffer layer 2130 on the light-emitting region II. The second active pattern 2160 may be spaced apart from the first active pattern 2150 along the first direction. Each of the first and the second active patterns 2150 and 2160 may include a material including silicon or oxide semiconductor.

Figure 27:
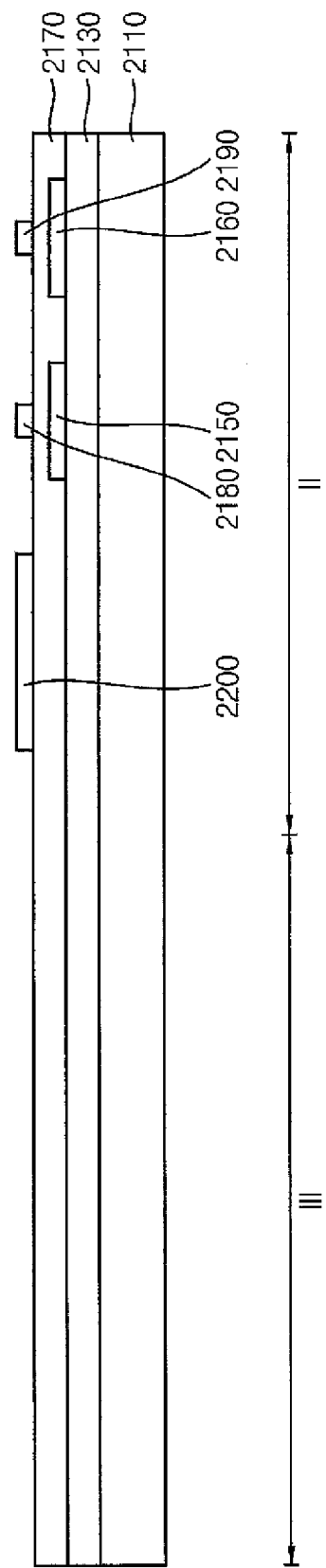

Referring to FIG. 27, a insulating interlayer 2170 is disposed on the substrate 2110 on which the buffer layer 2130 is disposed. Thereafter, a first gate electrode 2180, a second gate electrode 2190 and a first capacitor electrode 2200 are disposed on the insulating inter layer 2170.

The insulating interlayer 2170 may be disposed on the buffer layer 2130. The insulating interlayer 2170 may cover the first and second active patterns 2150 and 2160, and may extend into the transparent region III. In an exemplary embodiment, the insulating interlayer 2170 may include a silicon compound, a metal oxide, etc., for example. In exemplary embodiments, the insulating interlayer 2170 may include a silicon oxide. In an exemplary embodiment, the insulating interlayer 2170 may include a material substantially the same as that of the buffer layer 2130. In this case, as the insulating interlayer 2170 and the buffer layer 2130 may be provided as the same material in the transparent region III, the insulating interlayer 2170 and the buffer layer 2130 may have the same refractive index. Thus, a light transmittivity may be improved in the transparent region III.

The first gate electrode 2180 may be disposed on the insulating interlayer 2170 under which the first active pattern 2150 is positioned. The second gate electrode 2190 may be disposed on the insulating interlayer 2170 under which the second active pattern 2160 is positioned. Each of the first gate electrode 2180 and the second gate electrode 2190 may include metal, alloy, metal nitride, conductive metal oxide, a transparent conductive material, etc., for example.

The first capacitor electrode 2200 may be disposed on the insulating interlayer 2170. The first capacitor electrode 2200 may be spaced apart from the first gate electrode 2180 by predetermined distances. The first capacitor electrode 2200, the first gate electrode 2180, and the second gate electrode 2190 may include substantially the same material. In an exemplary embodiment, each of the first capacitor electrode 2200, the first gate electrode 2180, and the second gate electrode 2190 may include different materials.

Figure 28:
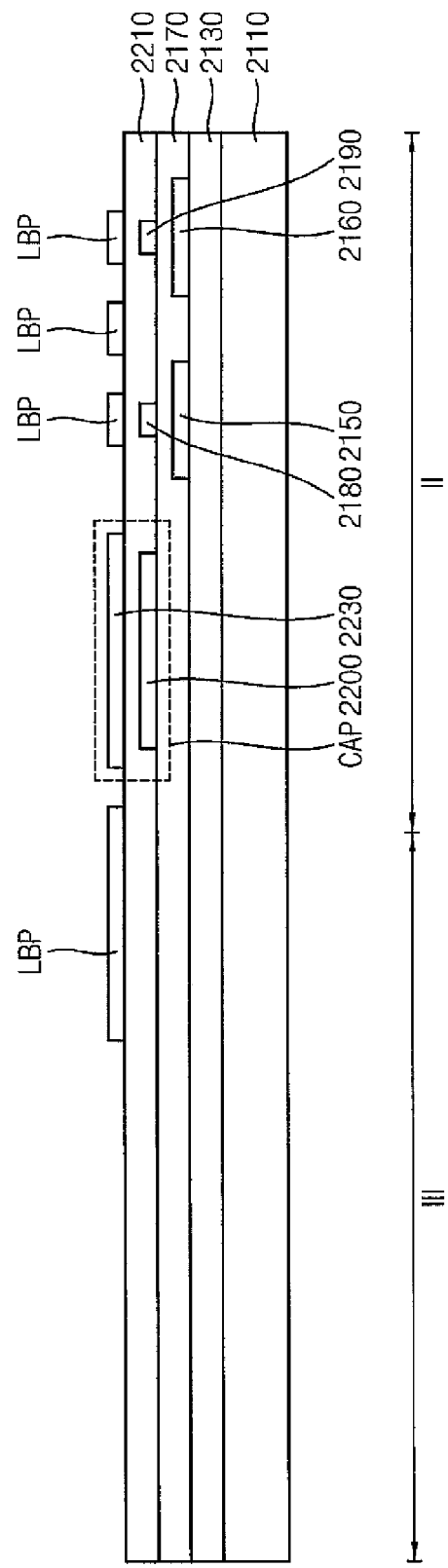

Referring to FIG. 28, a gate insulating layer 2210 is disposed on the substrate 2110 on which the first gate electrode 2180, the second gate electrode 2190 and the first capacitor electrode 2200 are disposed. Thereafter, a second capacitor electrode 2230 and a light-blocking pattern LBP are disposed on the gate insulating layer 2210.

The gate insulating layer 2210 may be disposed on the insulating interlayer 2170, the first capacitor electrode 2200, the first gate electrode 2180, and the second gate electrode 2190. The gate insulating layer 2210 may cover the first capacitor electrode 2200, the first gate electrode 2180, and the second gate electrode 2190, and may extend into the transparent region III. In an exemplary embodiment, the gate insulating layer 2210 may include a silicon compound, a metal oxide, etc., for example. In exemplary embodiments, the gate insulating layer 2210 may include a silicon oxide. In an exemplary embodiment, the gate insulating layer 2210 may include a material substantially the same as that of the buffer layer 2130 and the insulating interlayer 2170. In this case, as the gate insulating layer 2210, the insulating interlayer 2170 and the buffer layer 2130 may be provided as the same material in the transparent region III, the gate insulating layer 2210, the insulating interlayer 2170 and the buffer layer 2130 may have the same refractive index. Thus, a light transmittivity may be improved in the transparent region III.

The second capacitor electrode 2230 may be disposed on the gate insulating layer 2210 under which the first capacitor electrode 2200 is positioned. The second capacitor electrode 2230 may include a material substantially the same that of the first gate electrode 2180, the second gate electrode 2190, and the first capacitor electrode 2200. In an exemplary embodiment, each of the second capacitor electrode 2230, the first gate electrode 2180, the second gate electrode 2190, and the first capacitor electrode 2200 may include different materials.

The light-blocking pattern LBP may be disposed on the same layer as the second capacitor electrode 2230. The light-blocking pattern LBP is insulated from the second capacitor electrode 2230. The light-blocking pattern LBP may include the same material as the second capacitor electrode 2230.

The light-blocking pattern LBP is disposed in the light-emitting region II. The light-blocking pattern LBP partially overlaps the first gate electrode 180, the second gate electrode 2190, the first source electrode, the second source electrode 2300, the first drain electrode 2290 and the second drain electrode 2310. The light-blocking pattern LBP may be disposed in a region on which the first gate electrode 2180, the second gate electrode 2190, the first source electrode, the second source electrode 2300, the first drain electrode 2290 and the second drain electrode 2310 are not disposed in a plan view. That is, the light-blocking pattern LBP is disposed in a region on which a gate metal pattern including a gate electrode and a data metal pattern including a source electrode, a drain electrode and a data line are not disposed in a plan view.

Figure 29:
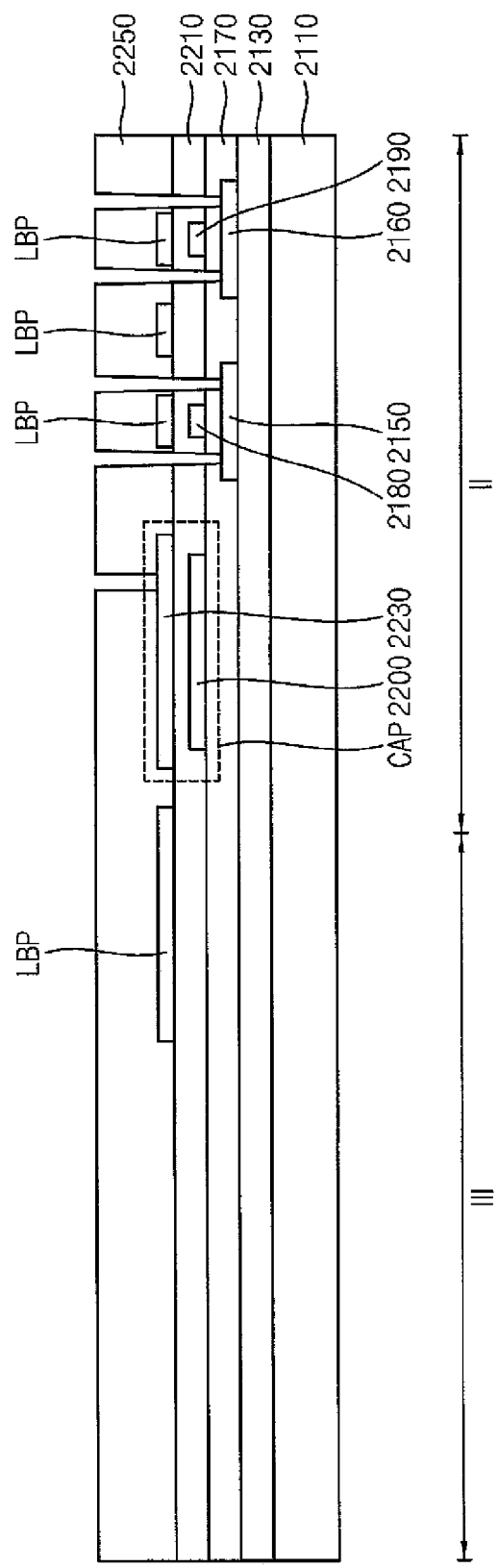

Referring to FIG. 29, a first insulating layer 2250 is disposed on the substrate 2110 on which the second capacitor electrode 2230 is disposed. Therefore, a contact hole penetrating the first insulating layer 2250 and a contact hole penetrating the first insulating layer 2250, the gate insulating layer 2210 and the insulating interlayer 2170 are defined.

Figure 30:
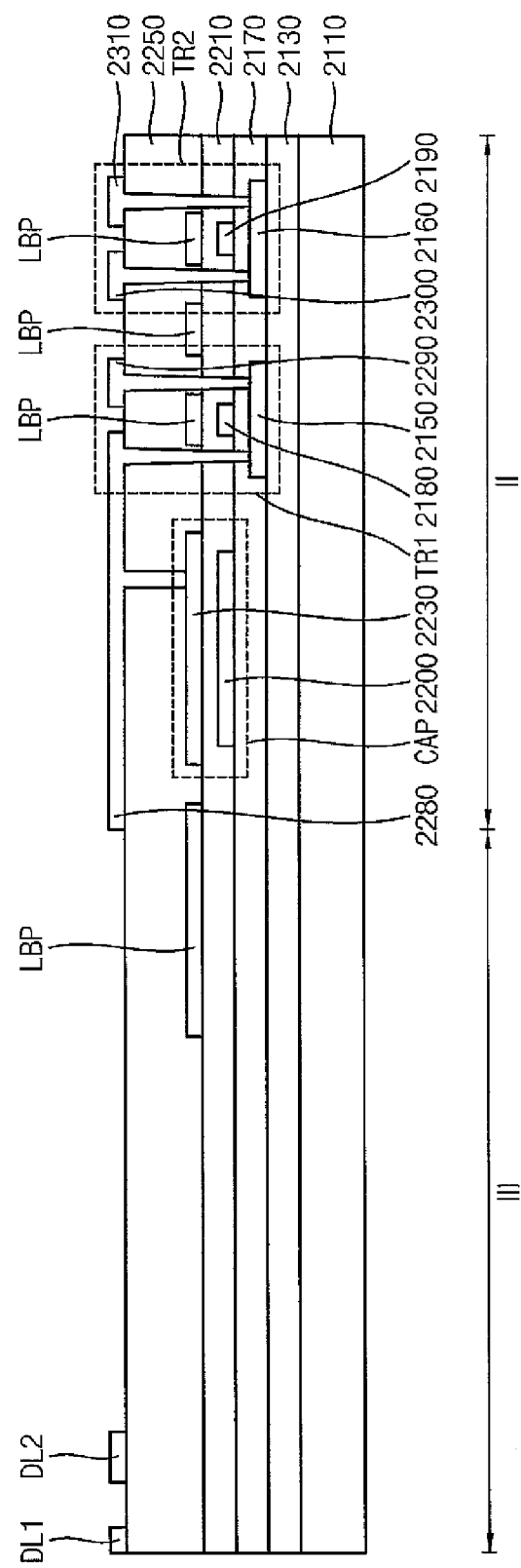

Referring to FIG. 30, a first source electrode, a first drain electrode 2290, a second source electrode 2300, a second drain electrode 2310 and a power supply electrode 2280 are provided.

The first source electrode and the first drain electrode 2290 may be contacted to the first active pattern 2150 by removing portions of the first insulating layer 2250, the gate insulating layer 2210, and the insulating interlayer 2170. Each of the first source electrode and the first drain electrode 2290 may include metal, alloy, metal nitride, conductive metal oxide, a transparent conductive material, etc., for example. These may be used alone or in a combination thereof.

The second source electrode 2300 and the second drain electrode 2310 may be contacted to the second active pattern 2160 by removing portions of the first insulating layer 2250, the gate insulating layer 2210, and the insulating interlayer 2170. Each of the second source electrode 2300 and the second drain electrode 2310 may include materials substantially the same as that of the first source electrode and the first drain electrode 2290.

The power supply electrode 2280 may be electrically contacted to the second capacitor electrode 2230 by removing a portion of the first insulating layer 2250, and may be electrically contacted to the first active pattern 2150 by removing a portion of the first insulating layer 2250, the gate insulating layer 2210, and the insulating interlayer 2170. The high power supply voltage applied to the power supply electrode 2280 may be provide to the second capacitor electrode 2230 and the first active pattern 2150. The power supply electrode 2280 may include materials substantially the same as that of the first drain electrode 2290, the second source electrode 300, and the second drain electrode 2310.

Figure 31:
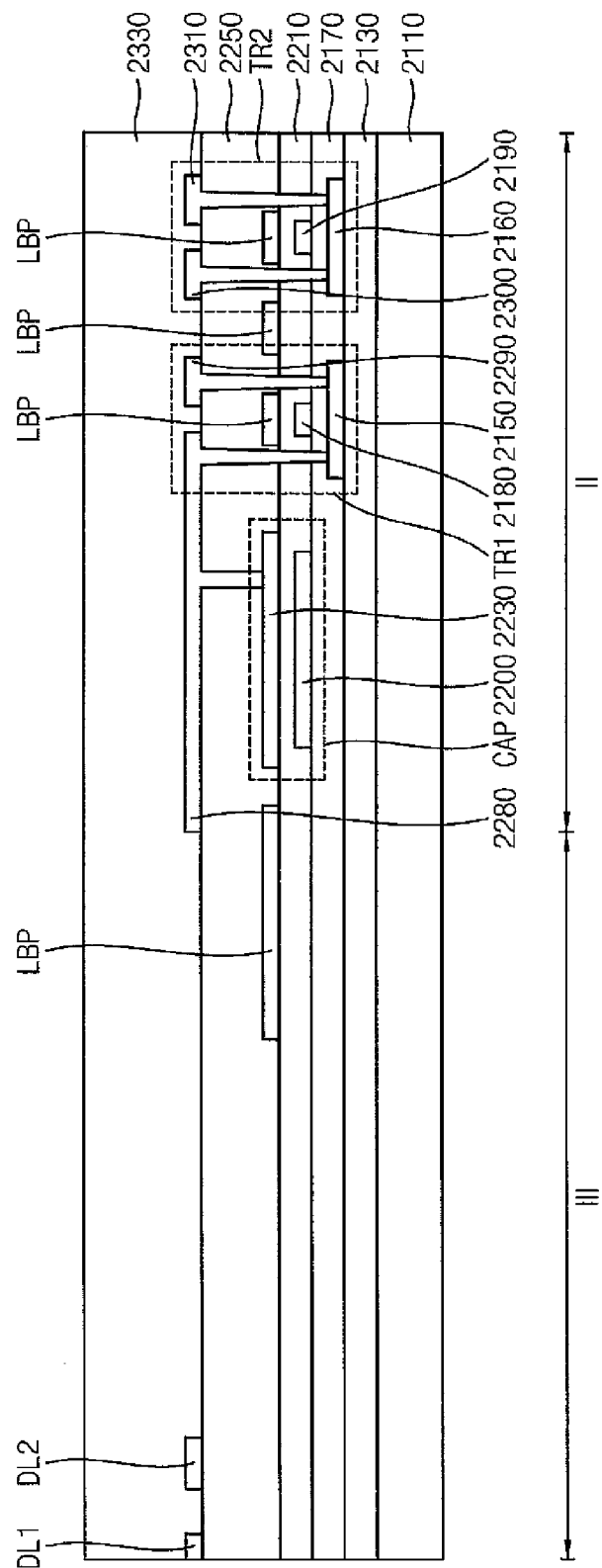

Referring to FIG. 31, a second insulating layer 2330 is disposed on the substrate 2110 on which the first source electrode, the first drain electrode 2290, the second source electrode 2300, the second drain electrode 2310 and the power supply electrode 2280 are disposed.

The second insulating layer 2330 may include an inorganic material. In an exemplary embodiment, the second insulating layer 2330 may include a silicon compound such as silicon oxide (SiOx), silicon nitride (SiNx), silicon oxynitride (SiOxNy), silicon oxycarbide (SiOxCy), silicon carbonitride (SiCxNy), etc. These may be used alone or in a combination thereof. In exemplary embodiments, the second insulating layer 2330 may include an organic material. In an exemplary embodiment, the second insulating layer 2330 may include polyimide-based resin, photoresist, acrylic-based resin, polyamide-based resin, siloxane-based resin, etc., for example. These may be used alone or in a combination thereof.

Figure 32:
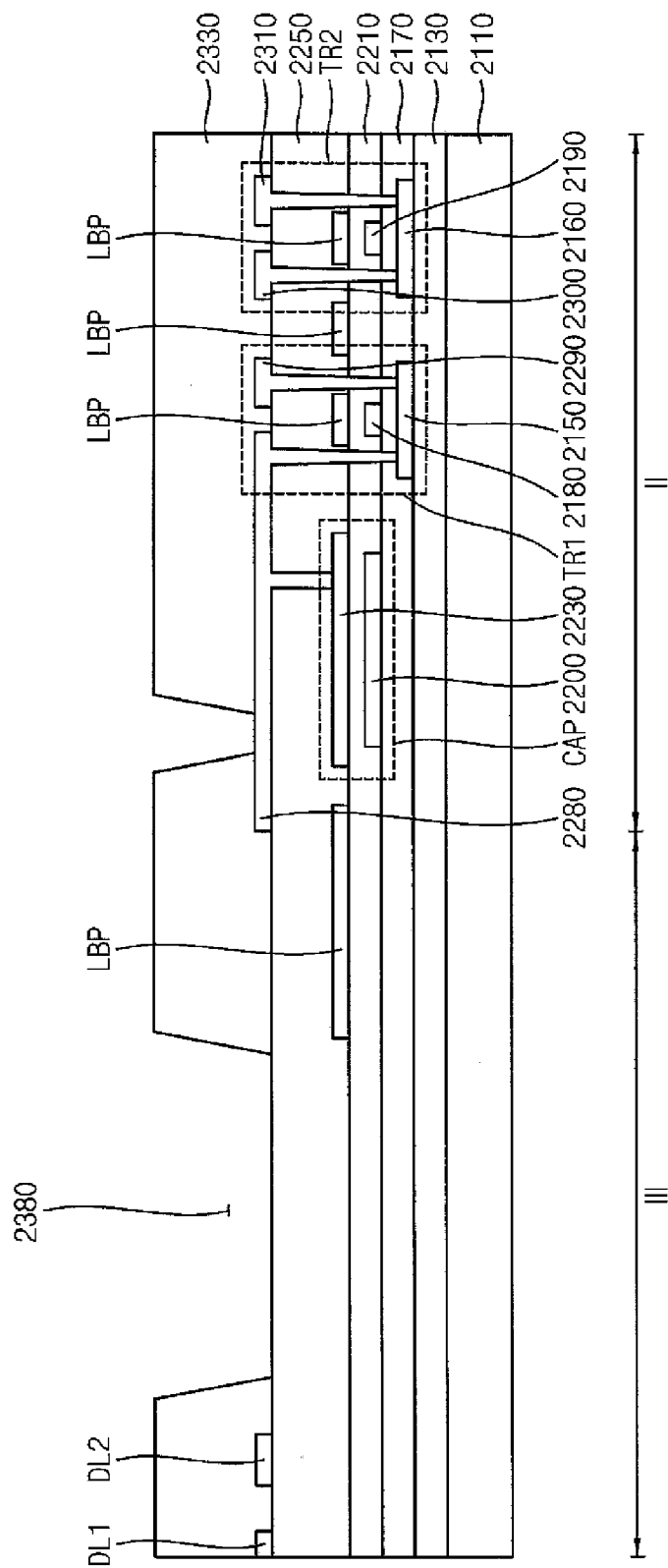

Referring to FIG. 32, the second insulating layer 2330 is patterned to form a transparent window 2380 and a contact hole.

The second insulating layer 2330 may cover the first source electrode, the first drain electrode 2290, the second source electrode 2300, and the second drain electrode 2310. The second insulating layer 2330 may be disposed such that the second insulating layer 2330 overlaps a portion of the power supply electrode 2280. That is, at least a portion of the power supply electrode 2280 may be exposed by the second insulating layer 2330 disposed thereon.

The second insulating layer 2330 may include an inorganic material. In an exemplary embodiment, the second insulating layer 2330 may include a silicon compound such as silicon oxide (SiOx), silicon nitride (SiNx), silicon oxynitride (SiOxNy), silicon oxycarbide (SiOxCy), silicon carbonitride (SiCxNy), etc. These may be used alone or in a combination thereof. In exemplary embodiments, the second insulating layer 2330 may include an organic material. In an exemplary embodiment, the second insulating layer 2330 may include polyimide-based resin, photoresist, acrylic-based resin, polyamide-based resin, siloxane-based resin, etc., for example. These may be used alone or in a combination thereof.

Figure 33:
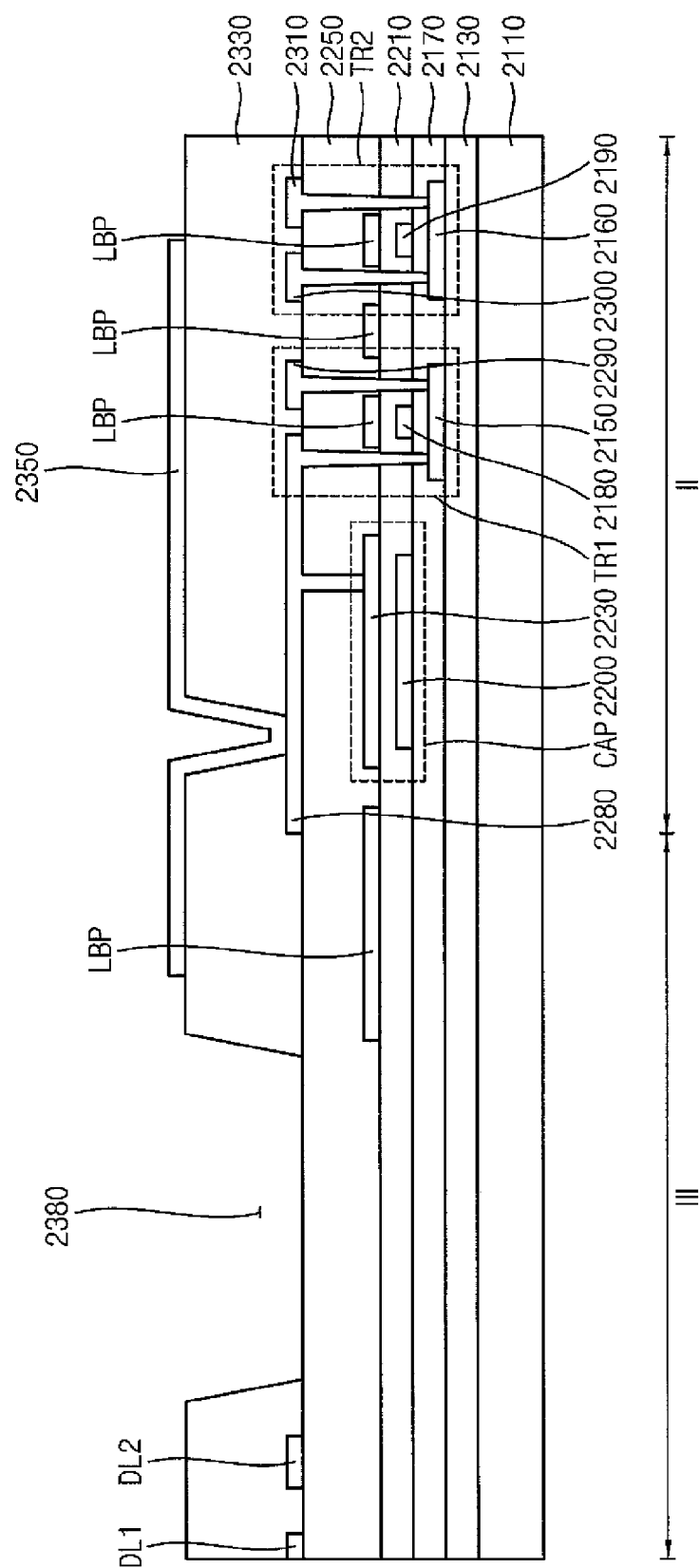

Referring to FIG. 33, a first electrode 2350 is disposed on the second insulating layer 2330.

The first electrode 2350 may be disposed on a portion of the power supply electrode 2280 and a portion of the second insulating layer 2330 in the light-emitting region II. In exemplary embodiments, the first electrode 2350 may be disposed as a substantially uniform thickness along upper surfaces of the power supply electrode 2280 and the second insulating layer 2330.

The first electrode 2350 may include metal, alloy, metal nitride, conductive metal oxide, a transparent conductive material, etc., for example. In an exemplary embodiment, the first electrode 2350 may include aluminum (Al), aluminum alloy, aluminum nitride (AlNx), silver (Ag), silver alloy, tungsten (W), tungsten nitride (WNx), copper (Cu), copper alloy, nickel (Ni), chrome (Cr), chrome nitride (CrNx), molybdenum (Mo), molybdenum alloy, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), ITO, stannum oxide (SnOx), indium oxide (InOx), gallium oxide (GaOx), IZO, etc., for example. These may be used alone or in a combination thereof.

Figure 34:
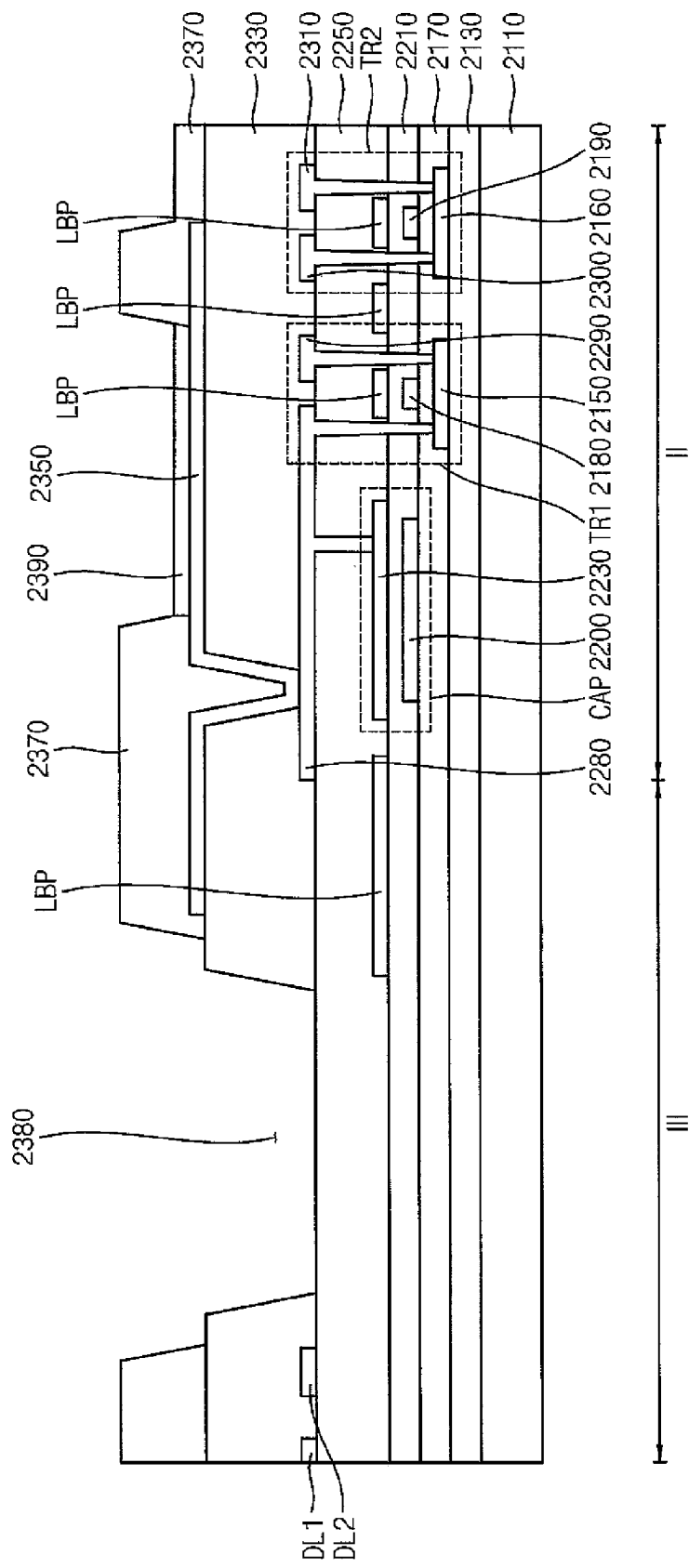

Referring to FIG. 34, a pixel defining layer 2370 is disposed on the substrate 2110 on which the first electrode 2350 is disposed. Thereafter, an emission layer 2390 is disposed on the first electrode 2350 which is exposed via the first opening of the pixel defining layer 2370.

The pixel defining layer 2370 may be disposed on the first electrode 2350 and a portion of the second insulating layer 2330. A first opening and a second opening may be defined in the pixel defining layer 2370. In the light-emitting region II, the first opening of the pixel defining layer 2370 may be positioned in a portion of the first electrode 2350 disposed on the second insulating layer 2330. The emission layer 2390 may be disposed in the first opening. In addition, the second opening of the pixel defining layer 2370 may be positioned in the transparent region III. The second opening may be defined as the transparent window 2380. The pixel defining layer 2370 may include organic materials or inorganic materials. These may be used alone or in a combination thereof. In an exemplary embodiment, the pixel defining layer 2370 may include materials substantially the same as that of the second insulating layer 2330.

The emission layer 2390 may be disposed on the first electrode 2350 which is exposed via the first opening of the pixel defining layer 2370. The emission layer 2390 may be provided using light emitting materials capable of generating different colors of light (e.g., a red color of light, a blue color of light, and a green color of light). In an exemplary embodiment, the emission layer 2390 may generally generate a white color of light by stacking a plurality of light emitting materials capable of generating different colors of light such as a red color of light, a green color of light, a blue color of light, etc., for example. A width of a first direction D1 of the first electrode 2350 is wider than a width of a first direction D1 of the emission layer 2390 by more than about 5μ. The first electrode 2350 may block light not blocked by the light-blocking patterns. The first electrode 2350 may additionally block light of the light-emitting region II, and thus visibility of a display device may be improved.

Referring to FIG. 24, a second electrode 2410 is disposed on the substrate 2100 on which the pixel defining layer 2370 is disposed.

The second electrode 2410 may be disposed on the pixel defining layer 2370, the emission layer 2390, the first insulating layer 2250 and the second insulating layer 2330. In an exemplary embodiment, the second electrode 2410 may be disposed as a substantially uniform thickness along upper surfaces of the pixel defining layer 2370, the emission layer 2390, the first insulating layer 2250 and the second insulating layer 2330. The second electrode 2410 may be contacted to a portion of the first insulating layer 2250 the second insulating layer 2330 via the transparent window 2380, and may extend into the transparent region III. That is, the second electrode 2410 may extend into the transparent window 2380. In exemplary embodiments, the second electrode 2410 may include a transparent conductive material. In an exemplary embodiment, the second electrode 2410 may include ITO, SnOx, InOx, GaOx, IZO, etc., for example. Thus, the second electrode 2410 positioned in the transparent region III may not substantially reduce a transmittivity of the transparent region III. In an exemplary embodiment, the second electrode 2410 may include materials substantially the same as that of the first electrode 2350.

According to the exemplary embodiment, the OLED device light-blocking patterns disposed on the tiny openings. Thus, light transmitted via the tiny openings may be blocked. Accordingly, visibility of a display device may be improved.

In addition, the first electrode includes opaque material, and thus the first electrode may block light not blocked by the light-blocking patterns. Accordingly, the first electrode additionally blocks light of the light-emitting region II, and thus visibility of a display device may be improved.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. An organic light emitting display device comprising:
    a substrate comprising a light-emitting region and a transparent region;
    a transistor disposed in the light-emitting region and comprising a gate electrode, a source electrode and a drain electrode overlapping the gate electrode;
    a capacitor disposed in the light-emitting region, and disposed adjacent to the transistor, and comprising a first capacitor electrode and a second capacitor electrode overlapping the first capacitor electrode; and
    a plurality of light-blocking patterns disposed on a different layer as a layer the gate electrode, the source electrode or the drain electrode are disposed, partially overlapping at least one of the gate electrode, the source electrode and the drain electrode, and overlapping a region on which the gate electrode, the source electrode and the drain electrode are not disposed in plan view.

2. The organic light emitting display device of claim 1, wherein the light-blocking patterns and the second capacitor electrode are disposed on the same layer.

3. The organic light emitting display device of claim 2, wherein the light-blocking patterns are insulated from the second capacitor electrode.

4. The organic light emitting display device of claim 1, wherein the light-blocking patterns comprise the same material as that of the second capacitor electrode.

5. The organic light emitting display device of claim 1, wherein the light-blocking patterns comprise opaque material.

6. The organic light emitting display device of claim 1, wherein the light-blocking patterns comprising:
    a first light-blocking pattern disposed in the light-emitting region; and
    a second light-blocking pattern extending in a first direction to be disposed in the light-emitting region and the transparent region, and overlapping a data line electrically connected with the source electrode.

7. The organic light emitting display device of claim 1, further comprising:
    a first electrode disposed in the light-emitting region and electrically connected with the drain electrode;
    an emission layer disposed on the first electrode; and
    a second electrode disposed on the emission layer, and disposed in the light-emitting region and the transparent region.

8. The organic light emitting display device of claim 7, wherein the first electrode comprises opaque material.

9. The organic light emitting display device of claim 7, wherein a width of a first direction of the first electrode is wider than a width of a first direction of the emission layer by more than about 5 micrometers.

10. A method for manufacturing an organic light emitting display device substrate, the method comprising:
    forming a gate electrode and a first capacitor electrode on a substrate comprising a light-emitting region and a transparent region; and
    forming a source electrode, a drain electrode, a second capacitor electrode and a plurality of light-blocking patterns on the substrate on which the gate electrode and a first capacitor electrode are disposed,
    wherein the light-blocking patterns are disposed on a different layer as a layer the gate electrode, the source electrode or the drain electrode are disposed, partially overlap the gate electrode, the source electrode or the drain electrode, and overlap a region on which the gate electrode, the source electrode and the drain electrode are not disposed in a plan view.

11. The method of claim 10, wherein the light-blocking patterns and the second capacitor electrode are disposed on the same layer.

12. The method of claim 11, wherein the light-blocking patterns are insulated from the second capacitor electrode.

13. The method of claim 10, wherein the light-blocking patterns comprise the same material as that of the second capacitor electrode.

14. The method of claim 10, wherein the light-blocking patterns comprise opaque material.

15. The method of claim 10, wherein the light-blocking patterns comprising:
    a first light-blocking pattern disposed in the light-emitting region; and
    a second light-blocking pattern extending in a first direction to be disposed in the light-emitting region and the transparent region, and overlapping a data line electrically connected with the source electrode.

16. A method for manufacturing an organic light emitting display device substrate, the method comprising:
    forming a gate electrode and a first capacitor electrode on a substrate comprising a light-emitting region and a transparent region; and
    forming a source electrode, a drain electrode, a second capacitor electrode and a plurality of light-blocking patterns on the substrate on which the gate electrode and a first capacitor electrode are disposed;
    forming a first electrode electrically connected with the drain electrode in the light-emitting region;
    forming an emission layer on the first electrode; and
    forming second electrode disposed on the emission layer,
    wherein the light-blocking patterns partially overlap the gate electrode, the source electrode or the drain electrode, and are disposed on a different layer as a layer the gate electrode, the source electrode or the drain electrode are disposed.

17. The method of claim 16, wherein the first electrode comprises opaque material.

18. The method of claim 16, wherein a width of a first direction of the first electrode is wider than a width of a first direction of the emission layer by more than about 5 micrometers.

* * * * *